US012733238B2

(12) United States Patent
Liu et al.

(10) Patent No.: US 12,733,238 B2
(45) Date of Patent: Sep. 8, 2026

(54) OHMIC ELECTRODE FOR TWO-DIMENSIONAL CARRIER GAS (2DCG) SEMICONDUCTOR DEVICE

(71) Applicant: Taiwan Semiconductor Manufacturing Co., Ltd., Hsinchu (TW)

(72) Inventors: Shih-Chien Liu, Hsinchu (TW); Yao-Chung Chang, Zhubei City (TW); Chun Lin Tsai, Hsin-Chu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 179 days.

(21) Appl. No.: 18/776,399

(22) Filed: Jul. 18, 2024

(65) Prior Publication Data

US 2024/0371951 A1 Nov. 7, 2024

Related U.S. Application Data

(63) Continuation of application No. 17/353,051, filed on Jun. 21, 2021, now Pat. No. 12,132,088.

(Continued)

(51) Int. Cl.
*H10D 64/23* (2025.01)
*H10D 30/01* (2025.01)
(Continued)

(52) U.S. Cl.
CPC ......... *H10D 64/256* (2025.01); *H10D 30/015* (2025.01); *H10D 30/4732* (2025.01); *H10D 64/01* (2025.01)

(58) Field of Classification Search
CPC ............. H01L 29/41766; H01L 29/401; H01L 29/66462; H01L 29/7783
See application file for complete search history.

(56) References Cited

U.S. PATENT DOCUMENTS

2001/0008226 A1 7/2001 Hung et al.
2002/0137276 A1 9/2002 Park
(Continued)

FOREIGN PATENT DOCUMENTS

CN 106158923 A 11/2016
CN 110233103 A * 9/2019 ........... H10D 64/256
(Continued)

OTHER PUBLICATIONS

English translation of CN-110233103-A (Year: 2019).*
(Continued)

*Primary Examiner* — William B Partridge
*Assistant Examiner* — David Paul Sedorook
(74) *Attorney, Agent, or Firm* — Eschweiler & Potashnik, LLC

(57) ABSTRACT

Various embodiments of the present disclosure are directed towards a two-dimensional carrier gas (2DCG) semiconductor device comprising an ohmic source/drain electrode with a plurality of protrusions separated by gaps and protruding from a bottom surface of the ohmic source/drain electrode. The ohmic source/drain electrode overlies a semiconductor film, and the protrusions extend from the bottom surface into the semiconductor film. Further, the ohmic source/drain electrode is separated from another ohmic source/drain electrode that also overlies the semiconductor film. The semiconductor film comprises a channel layer and a barrier layer that are vertically stacked and directly contact at a heterojunction. The channel layer accommodates a 2DCG that extends along the heterojunction and is ohmically coupled to the ohmic source/drain electrode and the other ohmic source/drain electrode. A gate electrode overlies the semiconductor film between the ohmic source/drain electrode and the other source/drain electrode.

20 Claims, 20 Drawing Sheets

Related U.S. Application Data

(60) Provisional application No. 63/176,979, filed on Apr. 20, 2021.

(51) Int. Cl.
*H10D 30/47* (2025.01)
*H10D 64/01* (2025.01)

(56) References Cited

U.S. PATENT DOCUMENTS

2006/0219997 A1* 10/2006 Kawasaki ......... H01L 29/66462 257/E29.05
2008/0173898 A1 7/2008 Ohmaki
2008/0217625 A1 9/2008 Kuroda et al.
2011/0297937 A1* 12/2011 Kim .................. H01L 29/78696 257/66
2012/0319127 A1 12/2012 Chowdhury et al.
2013/0295757 A1* 11/2013 Xu .................... H01L 21/28593 438/586
2013/0316507 A1* 11/2013 Saitoh ................. H01L 29/7788 438/285
2014/0091366 A1* 4/2014 Jeon .................... H01L 21/8252 257/195
2014/0239309 A1* 8/2014 Ramdani ............. H01L 29/2003 438/478
2015/0084104 A1 3/2015 Ando
2016/0071939 A1* 3/2016 Matsushita ......... H01L 29/7786 257/192
2018/0005827 A1 1/2018 Odnoblyudov et al.
2019/0326404 A1* 10/2019 Kumazaki ......... H01L 29/66462
2020/0075314 A1 3/2020 Chen et al.
2022/0052166 A1* 2/2022 Yeh ..................... H01L 29/4175

FOREIGN PATENT DOCUMENTS

CN 111863391 A 10/2020
CN 111933528 A 11/2020
JP H4118932 A 4/1992
JP 2008034438 A 2/2008
KR 20180053207 A 5/2018
TW 201943074 A 11/2019
WO 2020240310 A1 12/2020

OTHER PUBLICATIONS

Xin et al. "Optimization of AlGaN/GaN HEMT Ohmic Contacts for Improved Surface Morphology with Low Contact Resistance" CS MANTECH Conference, May 17-20, 2010, Portland, Oregon, USA, published May 2010.
Mahajan et al. "Ohmic contacts to AlGaN/GaN HEMTs: A Comparison of two different Ti/Al metal ratios" Physics of Semiconductor Devices, Environmental Science and Engineering, published in 2014.
Soltani et al. "Development and analysis of low resistance ohmic contact to n-AlGaN/GaN HEMT" Diamond & Related Materials, published on Jun. 24, 2006.
Nakajima et al. "GaN-based complementary metal-oxide-semiconductor inverter with normally off Pch and Nch MOSFETs fabricated using polarisation-induced holes and electron channels" IET Power Electronics / vol. 11, Issue 4 / p. 689-694, published on Feb. 23, 2018.
Greco et al. "Ohmic contacts to Gallium Nitride materials" Applied Surface Science 383 (2016) 324-345, published on Apr. 13, 2016.
Nakajima et al. "Generation and transportation mechanisms for two-dimensional hole gases in GaN/ AlGaN/GaN double heterostructures" J. Appl. Phys. 115, 153707 (2014), published on Apr. 21, 2014.
Power Electronics News. "Vertical GaN Devices for a New Power Electronics" Published on May 18, 2020.
Non-Final Office Action dated Jul. 19, 2023 for U.S. Appl. No. 17/353,051.
Non-Final Office Action dated Jan. 31, 2024 for U.S. Appl. No. 17/353,051.
Notice of Allowance dated Jul. 1, 2024 for U.S. Appl. No. 17/353,051.

* cited by examiner

OHMIC ELECTRODE FOR TWO-DIMENSIONAL CARRIER GAS (2DCG) SEMICONDUCTOR DEVICE

REFERENCE TO RELATED APPLICATIONS

This Application is a Continuation of U.S. application Ser. No. 17/353,051, filed on Jun. 21, 2021, which claims the benefit of U.S. Provisional Application No. 63/176,979, filed on Apr. 20, 2021, the contents of which are hereby incorporated by reference in their entirety.

BACKGROUND

Semiconductor devices based on silicon have been the standard for the past few decades. However, semiconductor devices based on alternative materials have been receiving increasing attention for advantages over silicon-based semiconductor devices. For example, semiconductor devices based on gallium nitride and other group III-V semiconductor materials have been receiving increasing attention due to increased channel mobility and enhanced thermal performance compared to silicon-based semiconductor devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
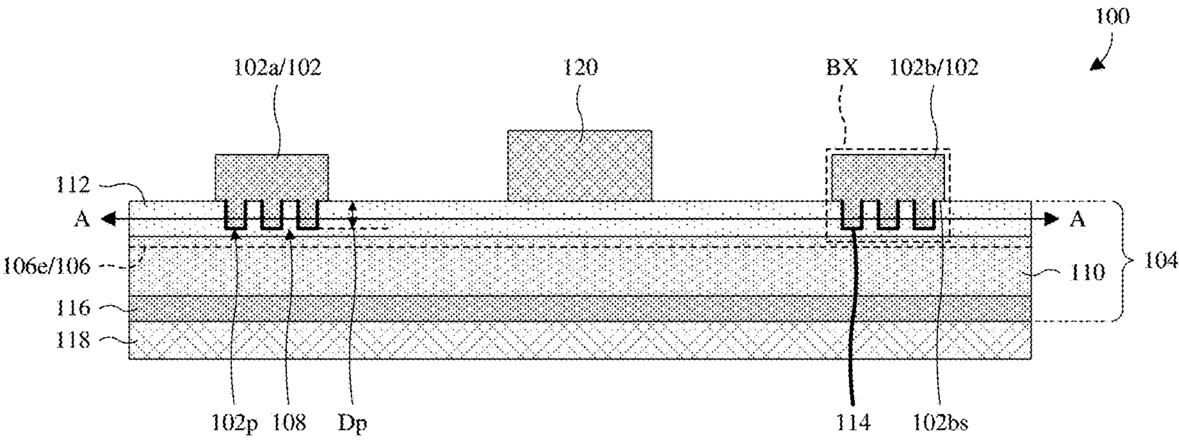
FIG. 1 illustrates a cross-sectional view of some embodiments of a two-dimensional carrier gas (2DCG) semiconductor device comprising an ohmic source/drain electrode with a plurality of protrusions protruding from a bottom of the ohmic source/drain electrode.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A two-dimensional carrier gas (2DCG) semiconductor device may comprise a semiconductor film, a 2DCG, a pair of ohmic source/drain electrodes, and a gate electrode. The semiconductor film comprises a channel layer and a barrier layer vertically stacked and directly contacting at a heterojunction. The 2DCG is in the channel layer and extends along the heterojunction. The ohmic source/drain electrodes ohmically couple to the 2DCG and are recessed into a top of the semiconductor film. Further, the ohmic source/drain electrodes are separated along a length of the 2DCG. The gate electrode overlies the semiconductor film and is between the source/drain electrodes.

Formation of an ohmic source/drain electrode may comprise etching the semiconductor film to form a single cuboid-shaped recess extending across a width of the 2DCG and subsequently filling the recess with ohmic metal. However, by removing material of the semiconductor film, the etching reduces the density of the 2DCG directly under the recess and hence increases the resistance of the 2DCG directly under the recess. Because the recess is cuboid shaped and extends across the width of the 2DCG, the increased resistance directly under the recess may block current flow across the ohmic source/drain electrode and may limit current flow to a single edge of the ohmic source/drain electrode facing the other ohmic source/drain electrode. Hence, the effective ohmic contact area may be small. The small effective ohmic contact area may lead to current crowding, whereby heat generation may be limited to a small area and may therefore increase the likelihood of device failure. Further, the small effective ohmic contact area may lead to high contact resistance from the ohmic source/drain electrode to the 2DCG.

To reduce the contact resistance, a depth of the recess may be increased. However, if the depth is too large, the 2DCG may be destroyed directly under the recess, which would increase the contact resistance. Further, uniformity of the etching decreases as the depth increases and may exacerbate intrinsic nonuniformity in the etching from wafer center to wafer edge, from lot to lot, and from wafer to wafer. This may, in turn, lead to increased nonuniformity in the contact resistance and may degrade bulk manufacturing yields of the 2DEG semiconductor device. Further yet, the semiconductor film may have a large band gap and hence a large resistance, whereby the contact resistance may be highly sensitive to nonuniformity in the etching.

Various embodiments of the present disclosure are directed towards a 2DCG semiconductor device comprising an ohmic source/drain electrode with a plurality of protrusions separated by gaps and protruding from a bottom surface of the ohmic source/drain electrode. The ohmic source/drain electrode overlies a semiconductor film, and the protrusions extend from the bottom surface into the semiconductor film. Further, the ohmic source/drain electrode is separated from another ohmic source/drain electrode that also overlies the semiconductor film. The semiconductor film comprises a channel layer and a barrier layer that are vertically stacked and directly contact at a heterojunction. The channel layer accommodates a 2DCG that extends along the heterojunction and is ohmically coupled to the ohmic source/drain electrode and the other ohmic source/drain electrode. A gate electrode overlies the semiconductor film between the ohmic source/drain electrode and the other source/drain electrode.

Because the vertical separation between the 2DCG and the ohmic source/drain electrode is larger at the gaps than directly under the protrusions, density of the 2DCG is larger directly under the gaps than directly under the protrusions. Hence, resistance of the 2DCG is smaller directly under the gaps than directly under the protrusions. Because the gaps may extend across the ohmic source/drain electrode and around the protrusions, the smaller resistance directly under the gaps may promote current may flow from edges of the protrusions on multiple sides of the ohmic source/drain electrode and hence the effective ohmic contact area may be large.

The large effective ohmic contact area may decrease current crowding and distribute current flow across the ohmic source/drain electrode. The decreased current crowding and the distributed current flow may increase the area over which heat generated during operation of the 2DCG semiconductor device is spread, which may enhance thermal performance and hence reliability of the 2DCG semiconductor device. Further, the large effective ohmic contact area may lead to low contact resistance from the ohmic source/drain electrode to the 2DCG.

Because of the large effective ohmic contact area, a depth to which the protrusions extend into the semiconductor film may be decreased while still maintaining a low contact resistance. The decreased depth may, in turn, increase etching uniformity while forming recesses within which the protrusions are formed. Further, because of the larger vertical separation at the gaps, and because the etching is not performed at the gaps, current flow directly under the gaps may be unaffected or minimally affected by nonuniformity in the etching. Because the current flow maybe unaffected or minimally affected by the nonuniformity, the contact resistance may be unaffected or minimally affected by the nonuniformity. This may increase yields.

With reference to FIG. 1, a cross-sectional view 100 of some embodiments of a 2DCG semiconductor device comprising a plurality of ohmic source/drain electrodes 102 with individual pluralities of protrusions 102*p* is provided. The 2DCG semiconductor device may, for example, be a group III-nitride device and/or a depletion mode high electron mobility transistor (D-HEMT). Other suitable device types are, however, amenable.

The ohmic source/drain electrodes 102 overlie a semiconductor film 104 and are laterally spaced. Further, the ohmic source/drain electrodes 102 ohmically couple to a 2DCG 106 in the semiconductor film 104. The protrusions 102*p* are separated by gaps 108 and protrude into the semiconductor film 104 from bottom surfaces 102*bs* of the ohmic source/drain electrodes 102, which are level or about level with a top surface of the semiconductor film 104. In alternative embodiments, the bottom surfaces 102*bs* are elevated or recessed relative to the top surface.

The semiconductor film 104 comprises a channel layer 110 and a barrier layer 112. The channel layer 110 underlies and directly contacts the barrier layer 112 at a heterojunction and hence has a different bandgap than the barrier layer 112. Further, the channel layer 110 is spaced from the ohmic source/drain electrodes 102 by the barrier layer 112. The barrier layer 112 is polarized so positive charge is shifted towards a bottom surface of the barrier layer 112, and negative charge is shifted towards a top surface of the barrier layer 112. The polarization may, for example, result from spontaneous and/or piezoelectric polarization effects.

Because the barrier layer 112 is polarized, the 2DCG 106 forms in the channel layer 110. The 2DCG 106 extends along the heterojunction and has a high concentration of mobile electrons. Because of the high concentration of mobile electrons, the 2DCG 106 is conductive and may also be referred to as a two-dimensional electron gas (2DEG) 106*e*.

Because the vertical separation between the 2DCG 106 and the ohmic source/drain electrodes 102 is larger at the gaps 108 than directly under the protrusions 102*p*, density of the 2DCG 106 is larger directly under the gaps 108 than directly under the protrusions 102*p*. Hence, resistance of the 2DCG 106 is smaller directly under the gaps 108 than directly under the protrusions 102*p*. As better seen hereafter (see, e.g., FIG. 2), the gaps 108 may extend laterally across the ohmic source/drain electrodes 102 and laterally around the protrusions 102*p*. Therefore, the smaller resistance directly under the gaps 108 may promote current may flow from edges of the protrusions 102*p* on multiple sides of the ohmic source/drain electrodes 102 and hence effective ohmic contact areas 114 of the ohmic source/drain electrodes 102 may be large.

The large effective ohmic contact areas 114 may decrease current crowding and distribute current flow across the ohmic source/drain electrodes 102. The decreased current crowding and the distributed current flow may increase the area over which heat generated during operation of the 2DCG semiconductor device is spread, which may enhance thermal performance and hence reliability. Further, the large effective ohmic contact areas 114 may lead to low contact resistance from the ohmic source/drain electrodes 102 to the 2DCG 106.

Because of the large effective ohmic contact areas 114, a depth Dp to which the protrusions 102*p* extend into the semiconductor film 104 may be decreased while still maintaining low contact resistances. Etching uniformity generally decreases as depth increases and generally increases as depth decreases. The decreased depth may, in turn, increase etching uniformity while forming recesses within which the protrusions 102*p* are formed. For example, etching uniformity may increase from wafer center to wafer edge, from lot to lot, and from wafer to wafer. Further, because of the larger vertical separation at the gaps 108, and because the etching is not performed at the gaps 108, current flow directly under the gaps 108 may be unaffected or minimally affected by nonuniformity in the etching. Because the current flow maybe unaffected or minimally affected by the nonuniformity, the contact resistance may be unaffected or minimally affected by the nonuniformity and yields may be increased.

With continued reference to FIG. 1, the semiconductor film 104 further comprises a buffer layer 116. The buffer layer 116 separates the channel and barrier layers 110, 112 from a substrate 118 underlying the semiconductor film 104. Further, the buffer layer 116 buffers and/or transitions between differences in lattice constants, crystalline structures, thermal expansion coefficients, other suitable parameters, or any combination of the foregoing from the substrate 118 to the channel layer 110. By buffering and/or transitioning between such differences, crystalline quality of the channel and barrier layers 110, 112 may be high and/or stress on the channel and barrier layers 110, 112 may be low. This may, for example, enhance performance of the 2DCG semiconductor device and/or reduce failure of the 2DCG semiconductor device.

A gate electrode 120 overlies the semiconductor film 104, laterally between the ohmic source/drain electrodes 102. During use of the 2DCG semiconductor device, the gate electrode 120 is selectively biased to generate an electric field that manipulates the continuity of the 2DCG 106 from a first ohmic source/drain electrode 102*a* to a second ohmic source/drain electrode 102*b*. For example, when the gate electrode 120 is biased with a voltage that is more than a threshold voltage, the gate electrode 120 may generate an electric field depleting an underlying portion of the 2DCG 106 of mobile carriers and breaking the continuity.

In some embodiments, the semiconductor film 104 is or comprises group III-V semiconductor materials or group II-VI semiconductor materials. In other embodiments, the semiconductor film 104 is or comprises some other suitable semiconductor materials for 2DCG semiconductor devices.

In some embodiments, the channel layer 110 is or comprises gallium nitride (e.g., GaN), gallium arsenide (e.g., GaAs), indium phosphide (e.g., InP), some other suitable group III-V material(s), or any combination of the foregoing. In some embodiments, the channel layer 110 is or comprises a binary group III-V material and/or comprises the same elements as the buffer layer 116. For example, the channel layer 110 and the buffer layer 116 may be or comprise gallium nitride. In some embodiments, the channel layer 110 is undoped.

In some embodiments, the barrier layer 112 is or comprises aluminum gallium nitride (e.g., AlGaN), indium aluminum nitride (e.g., InAlN), aluminum nitride (e.g., AlN), aluminum gallium arsenide (e.g., AlGaAs), indium aluminum arsenide (e.g., InAlAs), indium gallium arsenide (e.g., InGaAs), some other suitable group III-V material(s), or any combination of the foregoing. In some embodiments, the barrier layer 112 is or comprises a ternary group III-V material and/or is undoped. In some embodiments, the barrier layer 112 is aluminum gallium nitride and the channel layer 110 is gallium nitride.

In some embodiments, the buffer layer 116 is or comprises gallium nitride (e.g., GaN), gallium arsenide (e.g., GaAs), indium phosphide (e.g., InP), some other suitable group III-V material(s), or any combination of the foregoing.

In some embodiments, the substrate 118 is or comprises silicon, sapphire, some other suitable crystalline material, or any combination of the foregoing. In at least some embodiments in which the semiconductor film 104 is or comprises group III-V materials, the substrate 118 is devoid of group III-V semiconductor materials. In some embodiments, the substrate 118 is a bulk semiconductor substrate and/or is a semiconductor wafer.

In some embodiments, the ohmic source/drain electrodes 102 are or comprise titanium, aluminum, nickel, gold, some other suitable metal(s), or any combination of the foregoing. In some embodiments, each of the ohmic source/drain electrodes 102 is or comprises a four-layer stack comprising a titanium layer, an aluminum layer overlying the titanium layer, a nickel layer overlying the aluminum layer, and a gold layer overlying the nickel layer. In other embodiments, each of the ohmic source/drain electrodes 102 comprises a two-layer stack comprising a titanium layer and an aluminum layer overlying the titanium layer.

Each of the ohmic source/drain electrodes 102 has a first vertical separation and a second vertical separation from the 2DCG 106 and/or the heterojunction. The first vertical separation is directly under the protrusions 102*p*, and the second vertical separation is at the gaps 108 and is greater than the first vertical separation. In some embodiments, as will be better seen hereafter (see, e.g., FIG. 2), the gaps 108 may extend laterally across the ohmic source/drain electrodes 102. Therefore, in some embodiments, each of the source/drain electrodes 102 may have the second vertical separation continuously from a first side (or sidewall) of the source/drain electrode facing the other source/drain electrode to a second side (or sidewall) of the source/drain electrode opposite the first side (or sidewall). Similarly, each of the ohmic source/drain electrodes 102 has a first height and a second height respectively at the protrusions 102*p* and the gaps 108. The first height is at the protrusions 102*p*, and the second height is at the gaps 108 and is less than the first height. In some embodiments, each of the source/drain electrodes 102 may have the second height continuously from a first side (or sidewall) of the source/drain electrode facing the other source/drain electrode to a second side (or sidewall) of the source/drain electrode opposite the first side (or sidewall).

In some embodiments, the protrusions 102*p* of an ohmic source/drain electrode (e.g., the first or second ohmic source/drain electrode 102*a*, 102*b*) collectively have a greater surface area than a single cuboid shaped protrusion occupying a like sized area as the collective. By like sized area, it is meant that a two-dimensional (2D) projection of the single cuboid shaped protrusion onto a top surface of the substrate 118 has a same or substantially the same size (e.g., width and length), and occupies a same or substantially the same area, as a 2D projection of the protrusions 102*p* onto the top surface of the substrate 118.

In some embodiments, the gate electrode 120 is or comprises nickel, gold, platinum, iridium, titanium nitride, aluminum copper, palladium, some other suitable metal(s) and/or metallic material(s), or any combination of the foregoing. For example, the gate electrode 120 may be a multilayer nickel/gold stack, a multilayer platinum/gold stack, a multilayer palladium/gold stack, a multilayer iridium/gold stack, a multilayer titanium nitride/aluminum copper/titanium nitride stack, or some other suitable multilayer stack.

Figure 2:
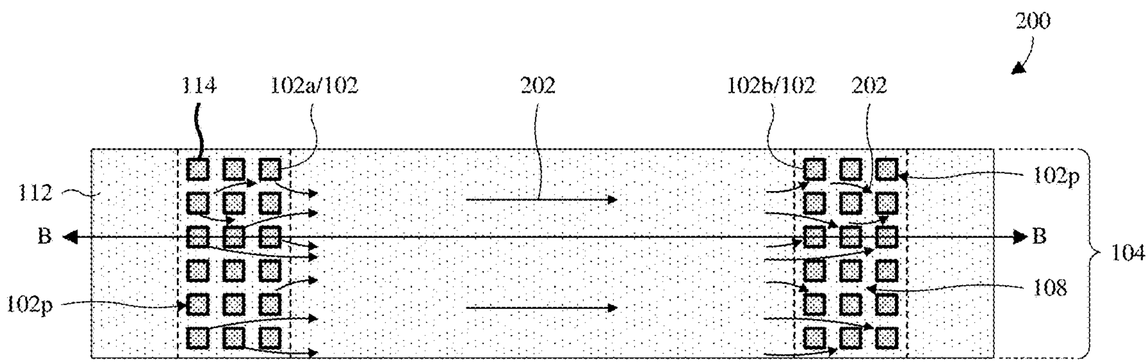
FIG. 2 illustrates a top view of some embodiments of the 2DCG semiconductor device of FIG. 1 along line A of FIG. 1.

With reference to FIG. 2, a top view 200 of some embodiments of the 2DCG semiconductor device of FIG. 1 is provided along line A of FIG. 1. Note that the cross-sectional view 100 of FIG. 1 may, for example, be taken along line B in FIG. 2. Other suitable locations are, however, amenable. Further, note that portions of the ohmic source/drain electrodes 102 that are above the protrusions 102*p* in FIG. 1 are shown in phantom.

The protrusions 102*p* of each ohmic source/drain electrode 102 are distributed across that ohmic source/drain electrode and are arranged in a plurality of rows and a plurality of columns. Note that the rows extend left to right in FIG. 2, and the columns extend top to bottom in FIG. 2. The protrusions 102*p* of each ohmic source/drain electrode 102 are arranged in six rows and three columns. However, in alternative embodiments, the protrusions 102*p* of each ohmic source/drain electrode 102 may be arranged in some other suitable number of rows and/or some other suitable number of columns. Further, the protrusions 102*p* are arranged in a periodic pattern and have a square layout. In alternative embodiments, the protrusions 102*p* have some other suitable layout.

Because the vertical separation (see, e.g., FIG. 1) between the 2DCG 106 and the ohmic source/drain electrodes 102 is larger at the gaps 108 than directly under the protrusions 102*p*, density of the 2DCG 106 is larger directly under the gaps 108 than directly under the protrusions 102*p*. Further, density of the 2DCG 106 is unaffected by or minimally affected by nonuniformity in etching to form recesses within which the protrusions 102*p* are formed. Accordingly, current 202 may flow laterally across the ohmic source/drain electrodes 102 and laterally around the protrusions 102*p* and may be unaffected by or minimally affected by nonuniformity in the etching to form the recesses. As described above, this may reduce current crowding, reduce contact resistance, and increase yields.

With reference to FIGS. 3A-3F, top views 300A-300F of some alternative embodiments of the 2DCG semiconductor device of FIG. 2 are provided.

Figure 3A:
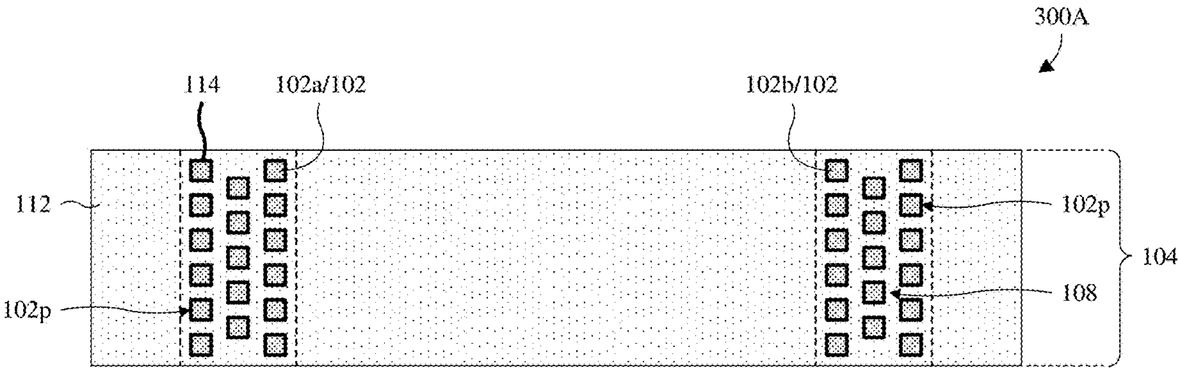
FIGS. 3A-3F illustrate top views of some alternative embodiments of the 2DCG semiconductor device of FIG. 2.

In FIG. 3A, the protrusions 102*p* are staggered along the rows, and even numbered columns are offset relative to odd numbered columns in a direction along which the columns extend. Further, even numbered columns have a different number of protrusions 102*p* per column than odd numbered columns. In alternative embodiments, even numbered columns have a same number of protrusions 102*p* per column as odd numbered columns. Note that column numbers are individual to the ohmic source/drain electrodes 102 and increase from left to right, beginning at one, in FIG. 3A.

Figure 3B:
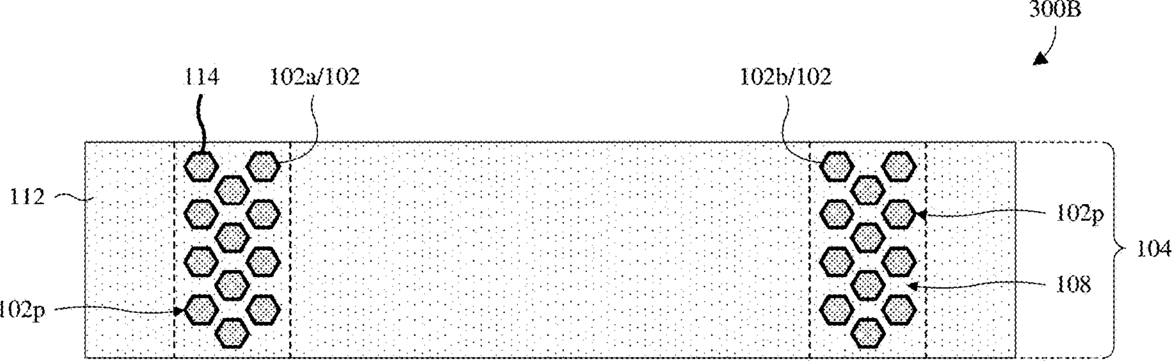

In FIG. 3B, the protrusions 102*p* are as in FIG. 3A, except that the protrusions 102*p* have a hexagonal layout. Further, numbers of protrusions 102*p* are different than in FIG. 3A and even numbered columns have a same number of protrusions 102*p* per column as odd numbered columns.

Figure 3C:
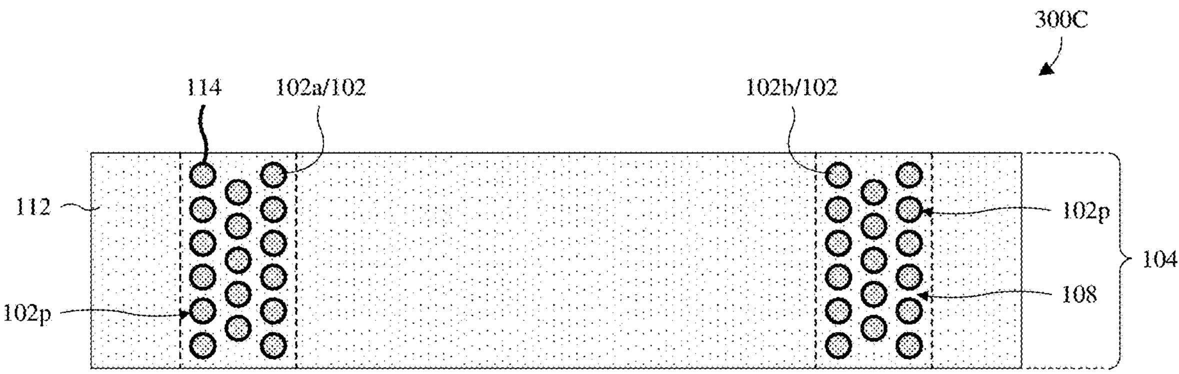

In FIG. 3C, the protrusions 102*p* are as in FIG. 3A, except that the protrusions 102*p* have a circular layout.

Figure 3D:
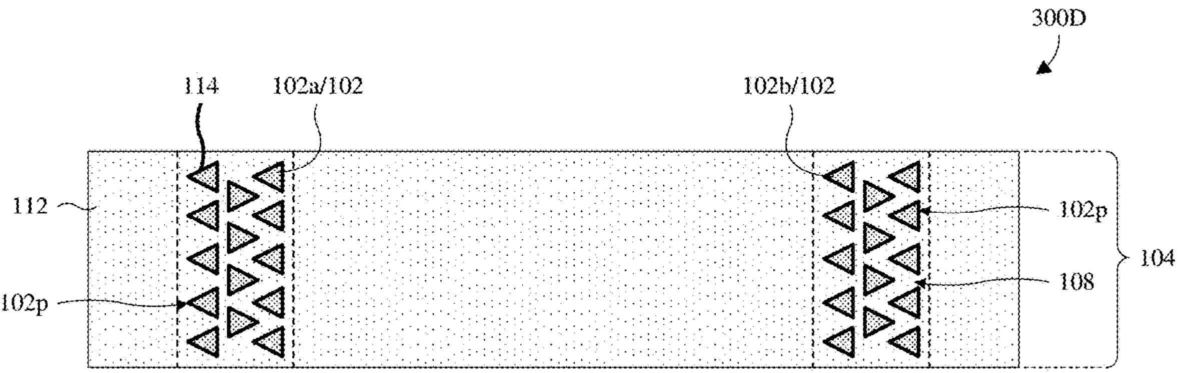

In FIG. 3D, the protrusions 102*p* are as in FIG. 3A, except that the protrusions 102*p* have a triangular layout. Further, numbers of protrusions 102*p* are different than in FIG. 3A.

Figure 3E:
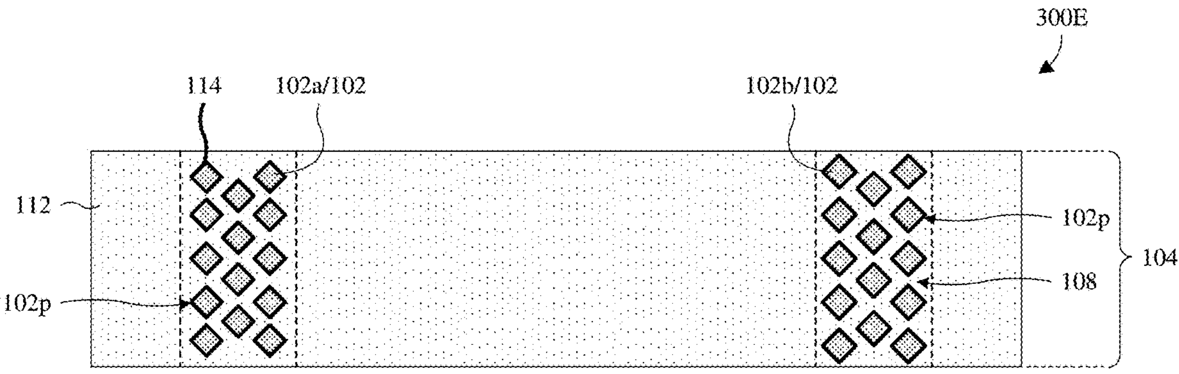

In FIG. 3E, the protrusions 102*p* are as in FIG. 3A, except that the protrusions 102*p* have a diamond-shaped layout. Further, numbers of protrusions 102*p* are different than in FIG. 3A.

Figure 3F:
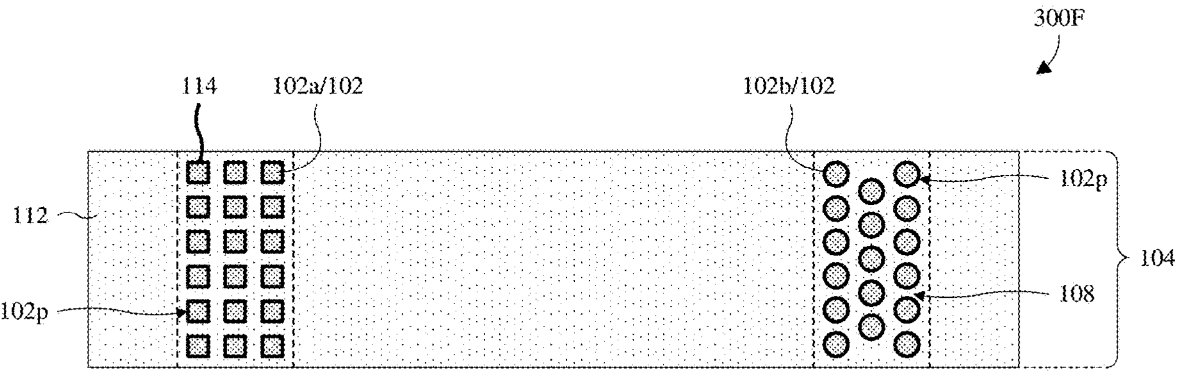

In FIG. 3F, the protrusions 102*p* of the first ohmic source/drain electrode 102*a* have a different layout than the protrusions 102*p* of the second ohmic source/drain electrode 102*b*. The protrusions 102*p* of the first ohmic source/drain electrode 102*a* have a layout as in FIG. 2, and the protrusions 102*p* of the second ohmic source/drain electrode 102*b* have a layout as in FIG. 3C. In alternative embodiments, the protrusions 102*p* of the first ohmic source/drain electrode 102*a* have a layout as in any of FIGS. 3A, 3B, 3D, and 3E or some other suitable layout, and/or the protrusions 102*p* of the second ohmic source/drain electrode 102*b* have a layout as in any of FIGS. 3A, 3B, 3D, and 3E or some other suitable layout.

While FIGS. 2 and 3A-3F are illustrated with specific numbers of protrusions 102*p*, more or less protrusions 102*p* are amenable. While FIGS. 2 and 3A-3F are illustrated with specific numbers of rows and columns, more or less rows are amenable and/or more or less columns are amenable. While FIGS. 3A and 3C-3E, and also the second ohmic source/drain electrode 102*b* of FIG. 3F, are illustrated with even numbered columns having a different number of protrusions 102*p* per column than odd numbered columns, the even numbered columns may alternatively have the same number of protrusions 102*p* per column as the odd numbered columns. While FIGS. 2 and 3B, and also the first ohmic source/drain electrode 102*a* of FIG. 3F, are illustrated with even numbered columns having a same number of protrusions 102*p* per column as odd numbered columns, the even numbered columns may alternatively have a different number of protrusions 102*p* per column than the odd numbered columns.

Figure 4:
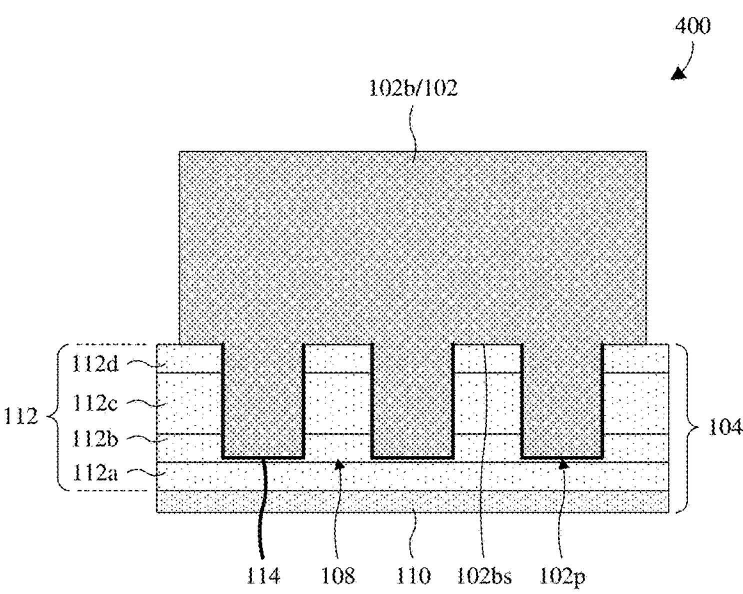
FIG. 4 illustrates an enlarged cross-sectional view of some embodiments of a portion of the 2DCG semiconductor device of FIG. 1.

With reference to FIG. 4, an enlarged cross-sectional view 400 of some embodiments of a portion the 2DCG semiconductor device of FIG. 1 within box BX of FIG. 1 is provided. As illustrated, the barrier layer 112 into which the protrusions 102*p* extend is a multilayer film. In alternative embodiments, the barrier layer 112 is a single-layer film. Further, in alternative embodiments, the barrier layer 112 is a multilayer film with more or less layers.

In some embodiments in which the 2DCG semiconductor device is based on gallium nitride, the barrier layer 112 comprises: 1) an aluminum nitride (e.g., AlN) layer 112*a;* 2) a first undoped aluminum gallium nitride (e.g., u-$Al_{0.25}GaN$) layer 112*b* overlying the aluminum nitride layer 112*a;* 3) an n-doped aluminum gallium nitride (e.g., n-$Al_{0.25}GaN$) layer 112*c* overlying the first undoped aluminum gallium nitride layer 112*b;* 4) and a second undoped aluminum gallium nitride (e.g., u-$Al_{0.25}GaN$) layer 112*d* overlying the n-doped aluminum gallium nitride layer 112*c*. In at least some of these embodiments, the channel layer 110 is or comprises undoped gallium nitride (e.g., u-GaN). Notwithstanding the specific materials identified above for the channel and barrier layers 110, 112, other suitable materials are amenable.

In some embodiments, the aluminum nitride layer 112*a*, the first undoped aluminum gallium nitride layer 112*b*, and the second undoped aluminum gallium nitride layer 112*d* have a thickness of about 1 nanometer, whereas the n-doped aluminum gallium nitride layer 112*c* has a thickness of about 8 nanometers and the channel layer 110 has a thickness of about 10 nanometers. In alternative embodiments, any one or combination of layers (e.g., 112*a*-112*d*) in the barrier layer 112 may have some other suitable thickness(es) and/or the channel layer 110 may have some other suitable thickness. In some embodiments, a doping concentration of the n-doped aluminum gallium nitride layer 112*c* is about $5\times10^{18}$ atoms per cubic centimeter (e.g., $cm^{-3}$). In alternative embodiments, the doping concentration is some other suitable value.

With reference to FIGS. 5A-5D, cross-sectional views 500A-500D of some alternative embodiments of the 2DCG semiconductor device of FIG. 1 are provided.

Figure 5A:
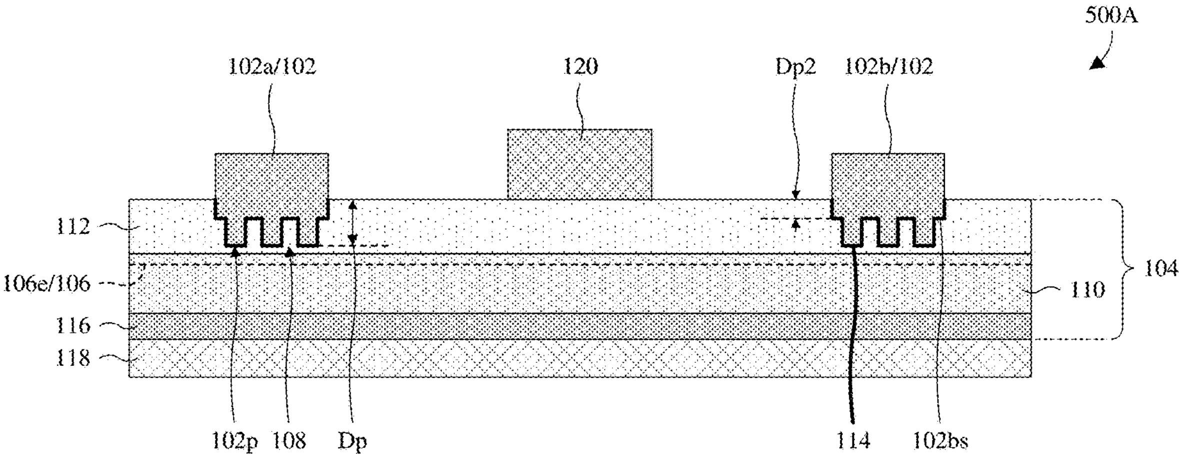
FIGS. 5A-5D illustrate cross-sectional views of some alternative embodiments of the 2DCG semiconductor device of FIG. 1.

In FIG. 5A, the bottom surfaces 102*bs* of the ohmic source/drain electrodes 102 are recessed relative to a top surface of the semiconductor film 104 to a depth Dp2. Such recessing may increase the effective ohmic contact areas 114 and may hence decrease contact resistances from the ohmic source/drain electrodes 102 to the 2DCG 106.

Figure 5B:
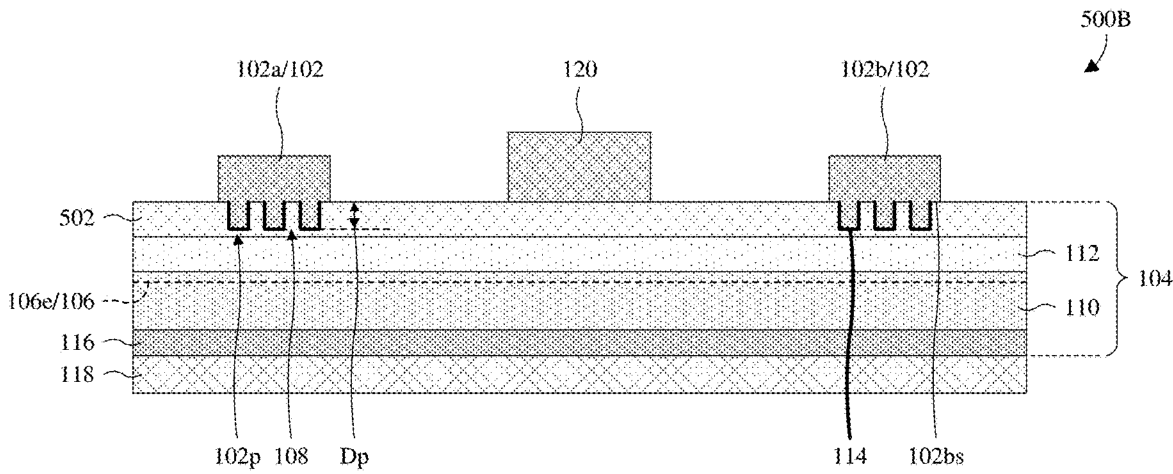

In FIG. 5B, the semiconductor film 104 further comprises a cap layer 502 overlying the channel and barrier layers 110, 112. The cap layer 502 may, for example, be employed to facilitate formation of ohmic contact from the ohmic source/drain electrodes 102 to the 2DCG 106. Further, the cap layer 502 may, for example, be employed to tune or otherwise enhance density of the 2DCG 106 and/or carrier mobility at the 2DCG 106. In at least some embodiments, this is achieved by doping the cap layer 502 with impurities to provide mobile carriers to the 2DCG 106.

In some embodiments, the cap layer 502 is or comprises gallium nitride (e.g., GaN), indium gallium nitride (e.g., InGaN), some other suitable group III-V material(s), or any combination of the foregoing. In some embodiments, the cap layer 502 is a same material as the channel layer 110. In some embodiments, the cap layer 502 is undoped. In other embodiments, the cap layer 502 is doped. In some embodiments, the cap layer 502 is a same material as the channel layer 110, but the channel layer 110 is undoped and the cap layer 502 is doped. In embodiments in which the cap layer 502 is doped, the cap layer 502 is doped with n-type donor impurities to provide mobile electrons to the 2DCG 106 because the 2DCG 106 is a 2DEG 106*e*. For example, in at least some embodiments in which the semiconductor film 104 is based on gallium nitride, the cap layer 502 may be doped with silicon, carbon, or some other suitable type of n-type donor impurity to provide mobile electrons.

Figure 5C:
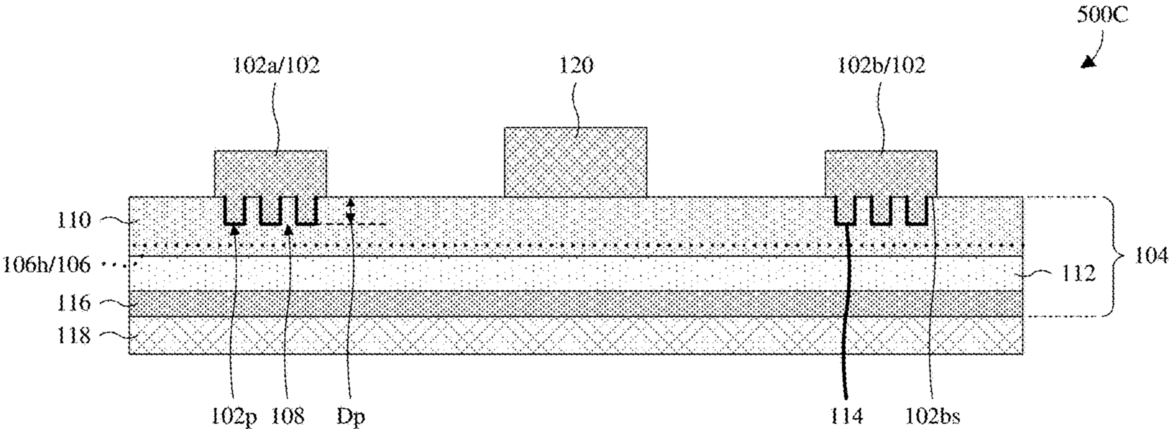

In FIG. 5C, the channel layer 110 overlies the barrier layer 112 and directly contacts the barrier layer 112 at a heterojunction. Further, the barrier layer 112 is spaced from the ohmic source/drain electrodes 102 by the channel layer 110. The barrier layer 112 is polarized so positive charge is shifted towards a bottom surface of the barrier layer 112, and negative charge is shifted towards a top surface of the barrier layer 112. The polarization may, for example, result from spontaneous and/or piezoelectric polarization effects.

Because the barrier layer 112 is polarized, the 2DCG 106 forms in the channel layer 110. The 2DCG 106 extends along the heterojunction and has a high concentration of mobile holes. Because of the high concentration of mobile holes, the 2DCG 106 is conductive and may also be referred to as a two-dimensional hole gas (2DHG) 106*h*.

Figure 5D:
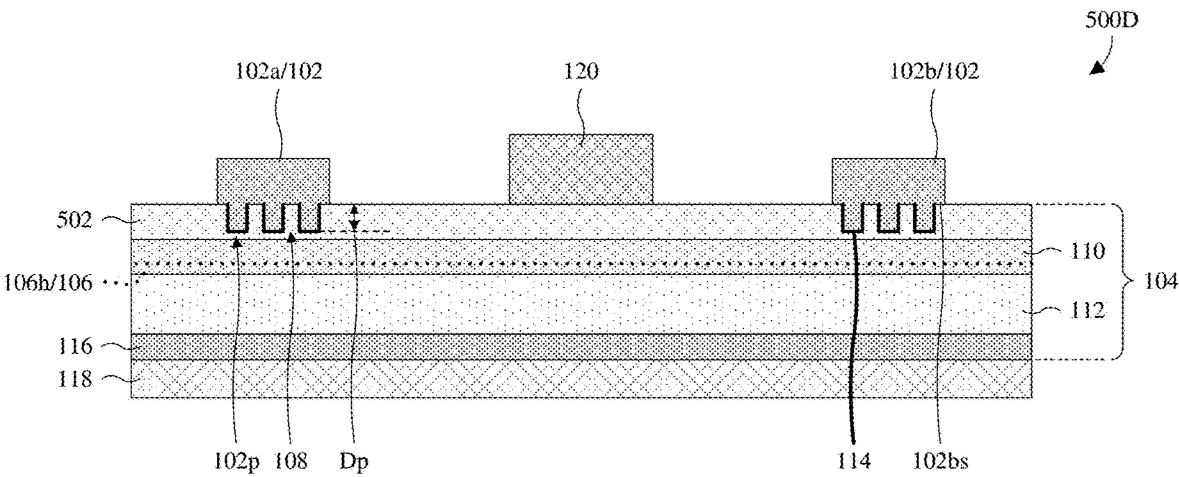

In FIG. 5D, the 2DCG semiconductor device is as in FIG. 5C, except that it further includes the cap layer 502 of FIG. 5B. In embodiments in which the cap layer 502 is doped, the cap layer 502 is doped with p-type acceptor impurities to provide mobile holes to the 2DCG 106 because the 2DCG 106 is a 2DHG 106*h*. For example, in at least some embodiments in which the semiconductor film 104 is based on gallium nitride, the cap layer 502 may be doped with magnesium or some other suitable type of p-type acceptor impurity to provide mobile holes.

Figure 6:
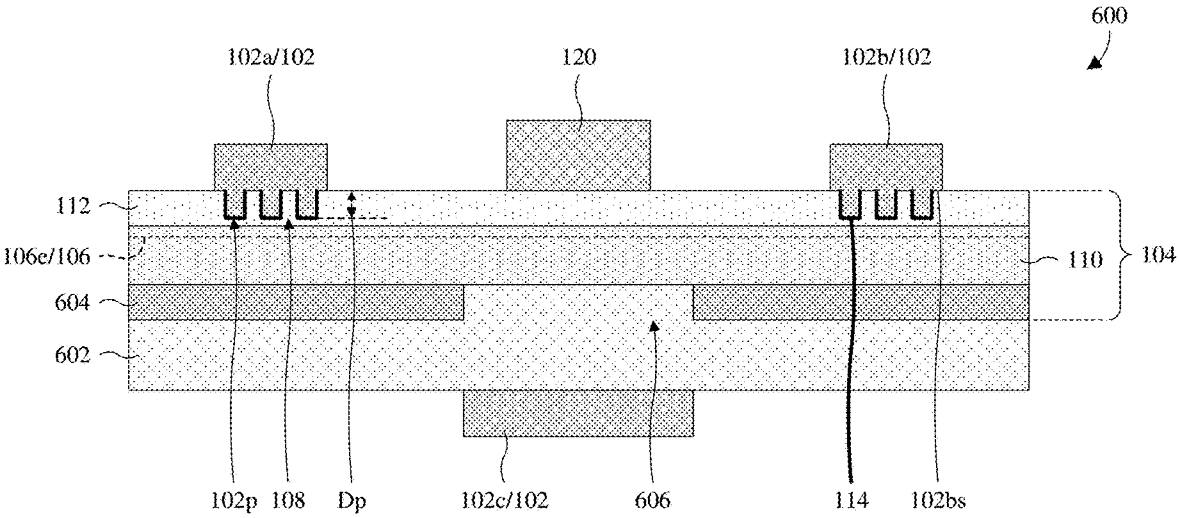
FIG. 6 illustrates a cross-sectional view of some embodiments of a vertical 2DCG semiconductor device comprising an ohmic source/drain electrode with a plurality of protrusions protruding from a bottom of the ohmic source/drain electrode.

With reference to FIG. 6, a cross-sectional view 600 of some embodiments of vertical 2DCG semiconductor device comprising a plurality of ohmic source/drain electrodes 102 with a plurality of protrusions 102*p* protruding from a bottom of the ohmic source/drain electrodes 102 is provided. The vertical 2DCG semiconductor device is as the 2DCG semiconductor device of FIG. 1 is described, except that a third ohmic source/drain electrode 102*c* underlies the gate electrode 120 on an underside of the semiconductor film 104. Further, the buffer layer 116 (see, e.g., FIG. 1) and the substrate 118 (see, e.g., FIG. 1) are omitted, and the semiconductor film 104 comprise a drift layer 602 and a current blocking layer (CBL) 604 separating the third ohmic source/drain electrode 102*c* from the channel and barrier layers 110, 112. The CBL 604 overlies and is inset into a top of the drift layer 602. The drift layer 602 is doped and extends to the barrier layer 112 through an aperture 606 in the CBL 604. The aperture 606 overlies the third ohmic source/drain electrode 102*c* and underlies the gate electrode 120.

During use of the 2DCG semiconductor device, the first and second ohmic source/drain electrodes 102*a*, 102*b* operate as source electrodes, and the third ohmic source/drain electrode 102*c* operate as a drain electrode, or vice versa. Further, current flows selectively from the drain electrode, through the aperture 606, to the source electrodes depending on whether the gate electrode 120 is biased with a voltage in excess of a threshold voltage. When the gate electrode 120 is biased with a voltage in excess of the threshold voltage, the gate electrode 120 may generate an electric field depleting an underlying portion of the 2DCG 106 of mobile carriers and hence preventing current from flowing from the drain electrode to the source electrodes. Otherwise, the 2DCG 106 may be continuous from the first ohmic source/drain electrode 102*a* to the second ohmic source/drain electrode 102*b* and current may flow. The 2DCG semiconductor device may, for example, be a vertical HEMT or some other suitable vertical device.

Breakdown voltage is increased by use of the vertical dimension to increase channel length. Increasing the thickness of the drift layer 602 increases the breakdown voltage, and decreasing the thickness decreases the breakdown voltage. Current that flows laterally from the aperture 606 has multiple parallel paths to a source electrode. Hence, ON resistance is decreased and current carrying capacity is increased. The capacity of current flowing vertically through the aperture 606 scales with the footprint size of the aperture 606, which scales in both lateral dimensions rather than only one lateral dimension. Because chip area is defined in both lateral dimensions and the footprint size of the aperture 606 scales in both lateral dimensions, the capacity of current flowing vertically per unit chip area (e.g., current density) may be high.

In some embodiments, the third ohmic source/drain electrode 102*c* is or comprises titanium, aluminum, nickel, gold, some other suitable metal(s), or any combination of the foregoing. In some embodiments, the third ohmic source/drain electrode 102*c* is or comprises a four-layer stack comprising a titanium layer, an aluminum layer underlying the titanium layer, a nickel layer underlying the aluminum layer, and a gold layer underlying the nickel layer. In some embodiments, the third ohmic source/drain electrode 102*c* is as the first and second ohmic source/drain electrodes 102*a*, 102*b* are described with regard to FIG. 1, except that the third ohmic source/drain electrode 102*c* is devoid of protrusions.

In some embodiments, the drift layer 602 is or comprise gallium nitride (e.g., GaN), gallium arsenide (e.g., GaAs), indium phosphide (e.g., InP), some other suitable group III-V material(s), or any combination of the foregoing. In some embodiments, the drift layer 602 is or comprises the same material as the channel layer 110. In at least some embodiments, the drift layer 602 is doped with an n-type donor impurity. For example, in at least some embodiments in which the semiconductor film 104 is based on gallium nitride, the drift layer 602 may be doped with silicon, carbon, or some other suitable type of n-type donor impurity.

In some embodiments, the CBL 604 is or comprise gallium nitride (e.g., GaN), gallium arsenide (e.g., GaAs), indium phosphide (e.g., InP), some other suitable group III-V material(s), or any combination of the foregoing. In some embodiments, the CBL 604 is or comprises the same material as the drift layer 602. In some embodiments, the CBL 604 is doped. In at least some embodiments in which the CBL 604 is doped, the CBL 604 is doped with a p-type donor impurity and hence an impurity having an opposite type as that of the drift layer 602. For example, in at least some embodiments in which the semiconductor film 104 is based on gallium nitride, the drift layer 602 may be doped with magnesium or some other suitable type of p-type acceptor impurity.

Figure 7A:
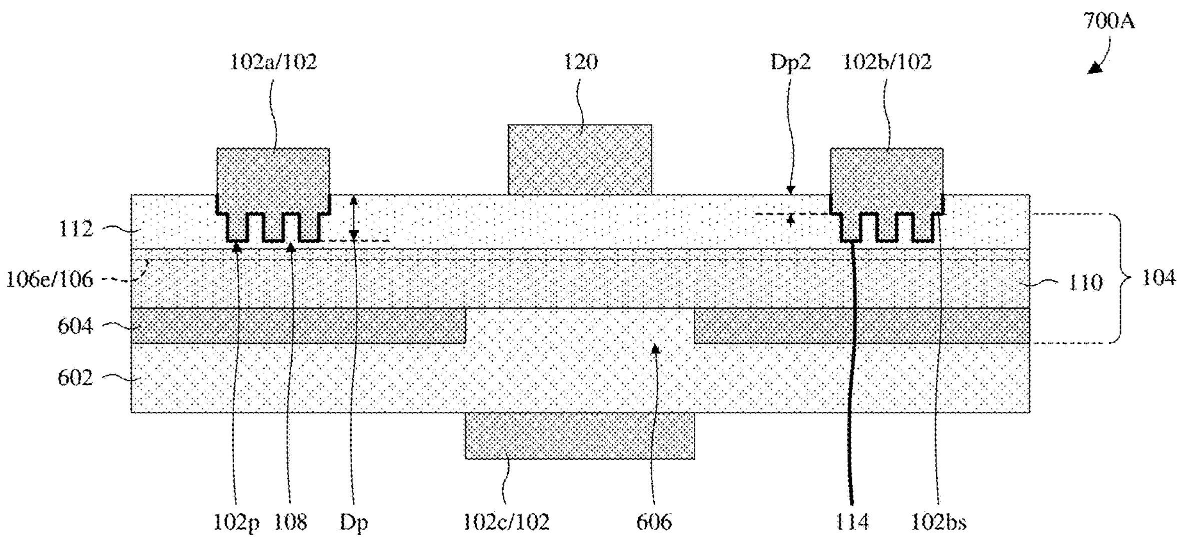
FIGS. 7A-7C illustrate cross-sectional views of some alternative embodiments of the vertical 2DCG semiconductor device of FIG. 6.
Figure 7B:
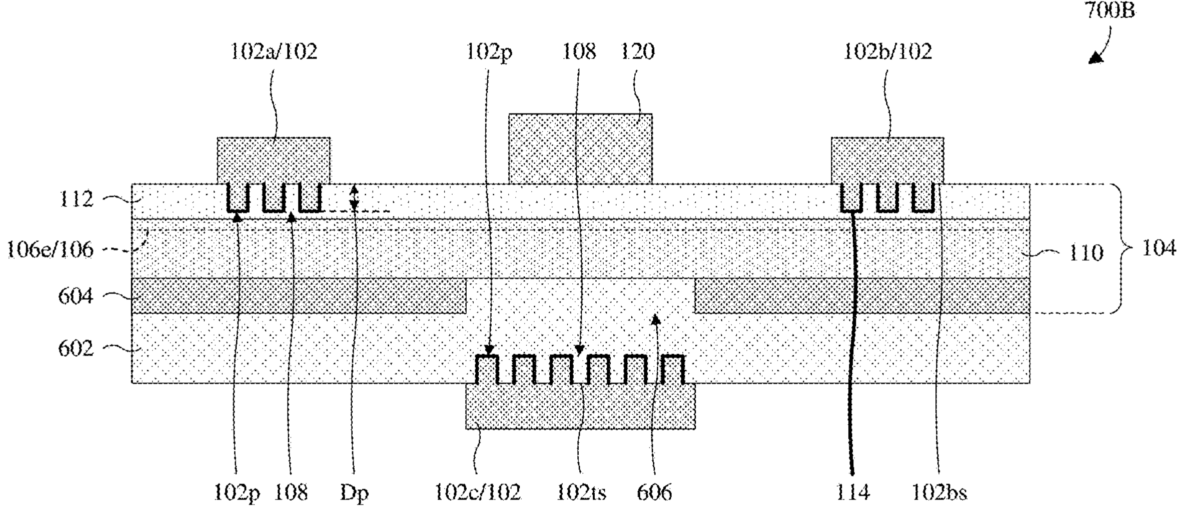
Figure 7C:
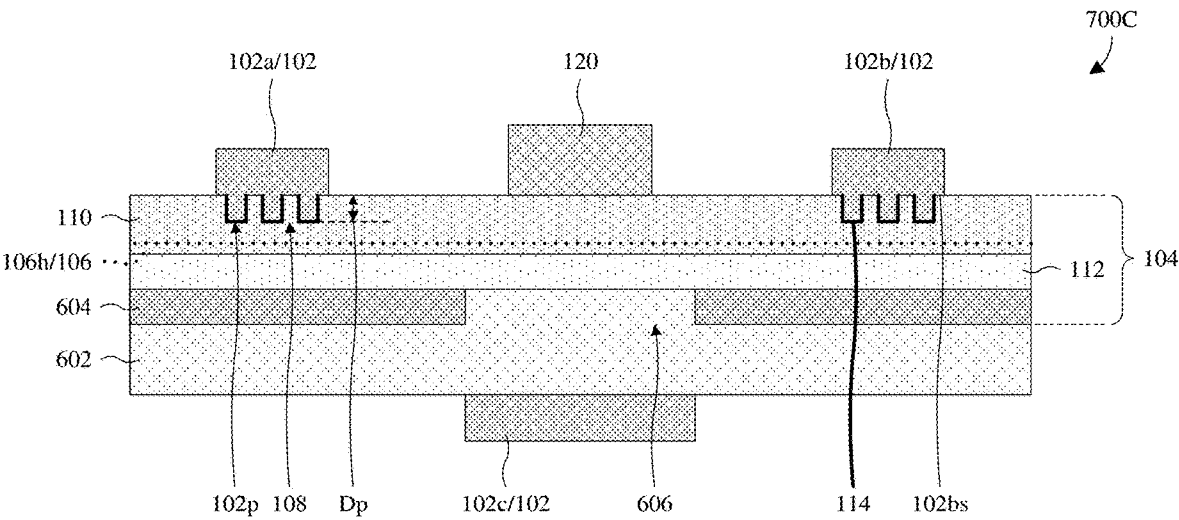

With reference to FIGS. 7A-7C, cross-sectional views 700A-700C of some alternative embodiments of the vertical 2DCG semiconductor of FIG. 6 is provided.

In FIG. 7A, the bottom surfaces 102*bs* of the ohmic source/drain electrodes 102 are recessed relative to a top surface of the semiconductor film 104 to a depth Dp2. Such recessing may increase the effective ohmic contact areas 114 and may hence decrease contact resistances from the ohmic source/drain electrodes 102 to the 2DCG 106.

In FIG. 7B, the third ohmic source/drain electrode 102*c* comprises a plurality of protrusions 102*p*. The protrusions 102*p* of the third ohmic source/drain electrode 102*c* are as the protrusions 102*p* of the first and second ohmic source/drain electrodes 102*a*, 102*b* are described. Hence, the protrusions 102*p* of the third ohmic source/drain electrode 102*c* increase the effective ohmic contact area 114 of the third ohmic source/drain electrode 102*c* and reduce the contact resistance of the third ohmic source/drain electrode 102*c*. Further, the protrusions 102*p* of the third ohmic source/drain electrode 102*c* protrude into the semiconductor film 104 from a top surface 102*ts* of the third ohmic source/drain electrodes 102*c*, which is level or about level with a bottom surface of the semiconductor film 104. In alternative embodiments, the top surface 102*ts* is elevated or recessed relative to the bottom surface.

In FIG. 7C, the channel layer 110 overlies the barrier layer 112 and directly contacts the barrier layer 112 at a heterojunction. Further, the barrier layer 112 is spaced from the ohmic source/drain electrodes 102 by the channel layer 110. The barrier layer 112 is polarized so positive charge is shifted towards a bottom surface of the barrier layer 112, and negative charge is shifted towards a top surface of the barrier layer 112. The polarization may, for example, result from spontaneous and/or piezoelectric polarization effects. Because the barrier layer 112 is polarized, the 2DCG 106 forms in the channel layer 110. The 2DCG 106 extends along the heterojunction and has a high concentration of mobile holes. Because of the high concentration of mobile holes, the 2DCG 106 is conductive and may also be referred to as a 2DHG 106*h*.

Figure 8A:
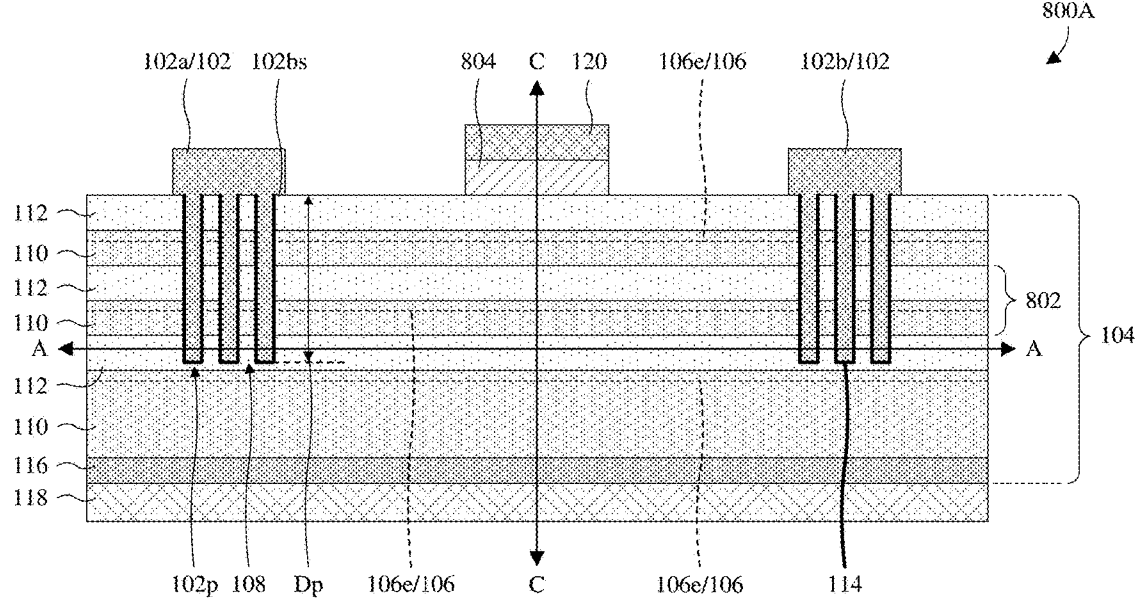
FIGS. 8A and 8B illustrate various cross-sectional views of some embodiments of a multi-channel 2DCG semiconductor device comprising an ohmic source/drain electrode with a plurality of protrusions protruding from a bottom of the ohmic source/drain electrode.
Figure 8B:
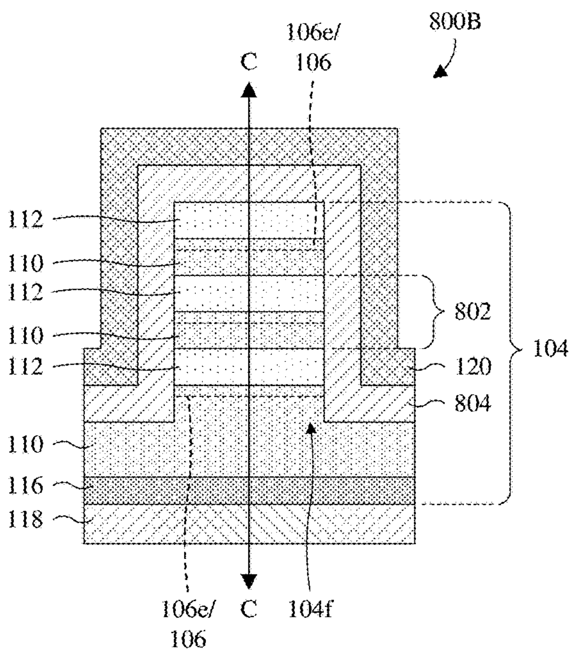

With reference to FIGS. 8A and 8B, various cross-sectional views 800A, 800B of some embodiments of a multi-channel 2DCG semiconductor device comprising a pair of ohmic source/drain electrodes 102 with individual pluralities of protrusions 102*p* is provided. FIG. 8B corresponds to a cross-sectional view 800B along line C in FIG. 8A, and FIG. 8A corresponds to a cross-sectional view 800A along line C in FIG. 8B. The multi-channel 2DCG semiconductor device may, for example, be a group III-nitride device and/or a depletion mode high electron mobility transistor (D-HEMT). Other suitable device types are, however, amenable.

The ohmic source/drain electrodes 102 overlie a semiconductor film 104 ohmically couple to a plurality of 2DCGs 106 in the semiconductor film 104 at individual effective ohmic contact areas 114. The protrusions 102*p* are separated by gaps 108 and protrude into the semiconductor film 104 from bottom surfaces 102*bs* of the ohmic source/drain electrodes 102, which are level or about level with a top surface of the semiconductor film 104. In alternative embodiments, the bottom surfaces 102*bs* are elevated or recessed relative to the top surface.

The semiconductor film 104 overlies a substrate 118 and forms a fin structure 104*f* (sec, e.g., FIG. 8B). Further, the semiconductor film 104 comprises a buffer layer 116 and a plurality of heterojunction structures 802 vertically stacked over the buffer layer 116. The buffer layer 116 buffers and/or transitions between differences in lattice constants, crystalline structures, thermal expansion coefficients, other suitable parameters, or any combination of the foregoing from the substrate 118 to the heterojunction structures 802.

The heterojunction structures 802 comprise individual channel layers 110 and individual barrier layers 112. The channel layers 110 underlie and directly contact the corresponding barrier layers 112 at heterojunctions. The barrier layers 112 are polarized so positive charge is shifted towards bottom surfaces of the barrier layers 112. Because of the polarization, the 2DCGs 106 form in the channel layers 110. The 2DCGs 106 extend respectively along the heterojunctions and have a high concentration of mobile electrons. Because of the high concentration, the 2DCGs 106 may also be referred to as a 2DEGs 106*e*.

A gate electrode 120 and a gate dielectric layer 804 overlie and straddle the fin structure 104*f*, laterally between the ohmic source/drain electrodes 102. Further, the gate dielectric layer 804 separates the gate electrode 120 from the fin structure 104*f*. During use of the 2DCG semiconductor device, the gate electrode 120 is selectively biased to generate an electric field that manipulates the continuity of the 2DCGs 106 from a first ohmic source/drain electrode 102*a* to a second ohmic source/drain electrode 102*b*.

The ohmic source/drain electrodes 102 are as described above. Hence, the effective ohmic contact areas 114 of the ohmic source/drain electrodes 102 are large. The large effective ohmic contact areas 114 may, in turn, reduce contact resistances from the ohmic source/drain electrodes 102 to the 2DCGs 106. Further, the large effective ohmic contact areas 114 may reduce current crowding, thereby enhancing thermal performance and reliability.

Because the multi-channel 2DCG semiconductor device comprises a plurality of 2DCGs 106 (e.g., channels), current flow may be spread across the 2DCGs 106 and current carrying capacity may be increased. Further, because the protrusions 102*p* are separated by gaps 108, the protrusions 102*p* may extend through the 2DCGs 106 without breaking the continuity of the 2DCGs 106 laterally across the ohmic source/drain electrodes 102. This is more readily seen in, for example, FIG. 2, which may be taken along line A in FIG. 8A.

In some embodiments, the channel layers 110 are each as their counterpart is described regard to FIG. 1 and/or the barrier layers 112 are each as their counterpart is described with regard to FIG. 1. In some embodiments, the buffer layer 116, the substrate 118, the gate electrode 120, or any combination of the foregoing is/are as described with regard to FIG. 1. In some embodiments, the gate dielectric layer 804 is or comprises silicon oxide, a high k dielectric, some other suitable dielectric(s), or any combination of the foregoing.

Figure 9A:
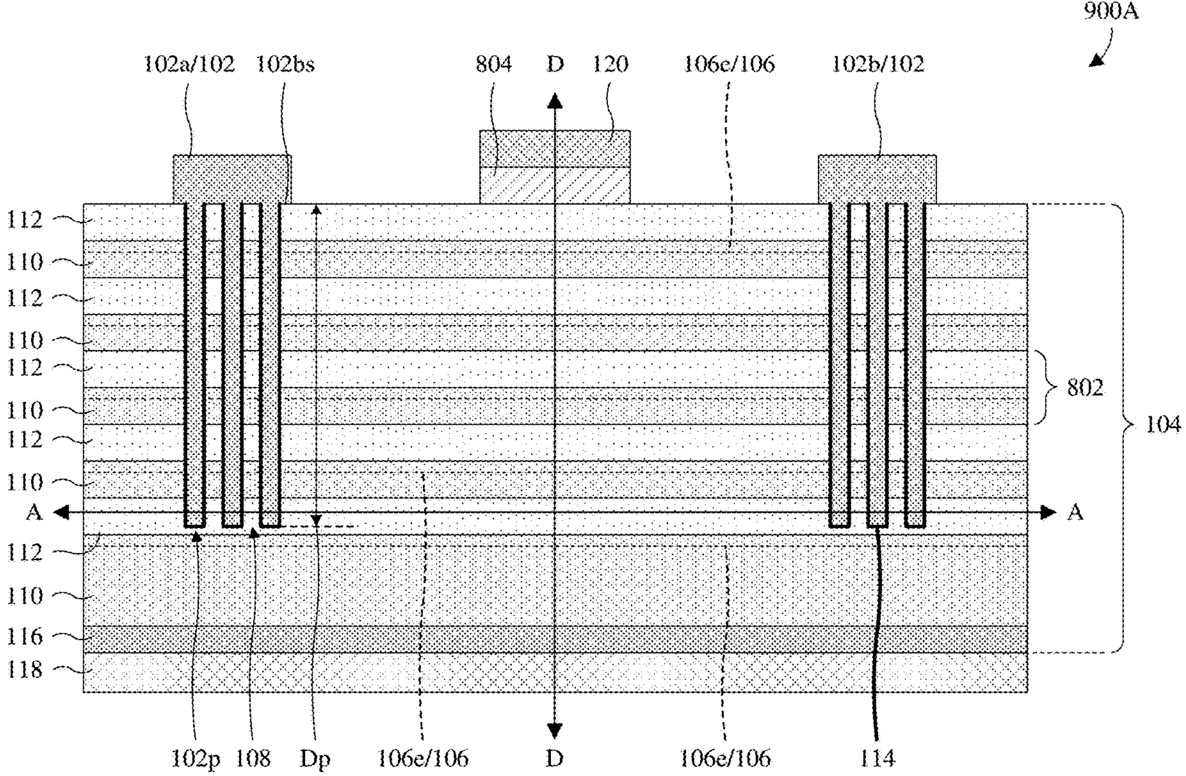
FIGS. 9A and 9B illustrate various cross-sectional views of some alternative embodiments of the multi-channel 2DCG semiconductor device of FIGS. 8A and 8B.
Figure 9B:
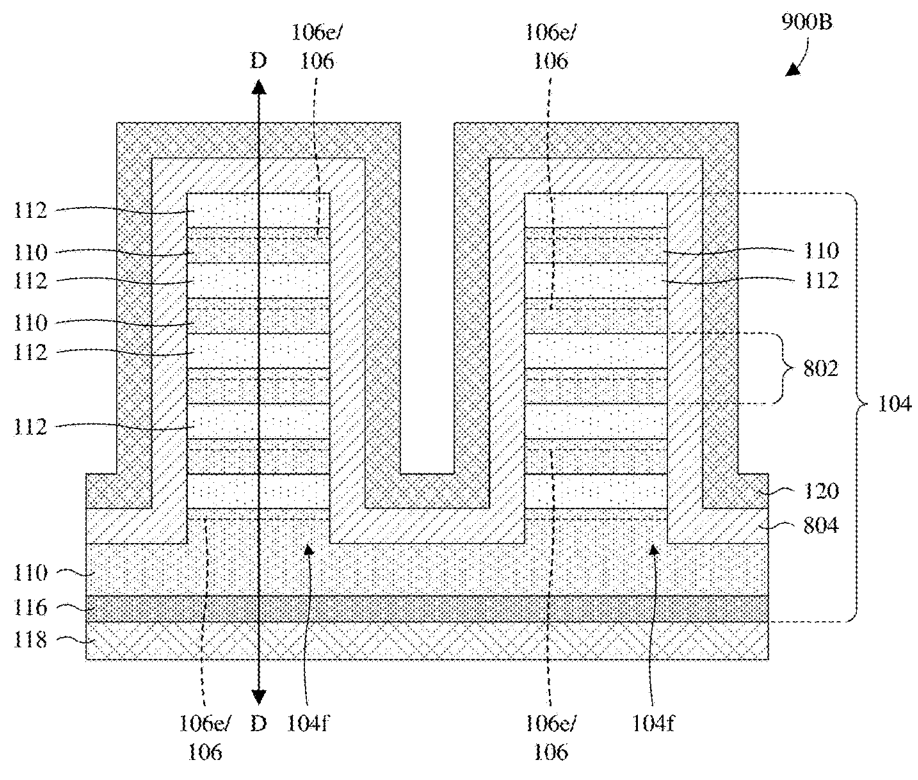

With reference to FIGS. 9A and 9B, various cross-sectional views 900A, 900B of some alternative embodiments of the multi-channel 2DCG semiconductor device of FIGS. 8A and 8B is provided in which the multi-channel 2DCG semiconductor device has multiple fin structures 104*f* and additional heterojunction structures 802. FIG. 9B corresponds to a cross-sectional view 900B along line D in FIG. 9A, and FIG. 9A corresponds to a cross-sectional view 900A along line D in FIG. 9B. Further, the top view 200 of FIG. 2 may, for example, be taken along line A in FIG. 9A.

While FIGS. 2 and 3A-3F describe layouts and arrangements of protrusions 102*p* with regard to FIG. 1, the layouts and arrangements are applicable to any of FIGS. 4, 5A-5D, 6, 7A-7C, 8A, 8B, 9A, and 9B. For example, the protrusions 102*p* of FIG. 8A may have circular layouts as in FIG. 3C. While FIG. 4 describes multilayered embodiments of the barrier layer 112 with regard to FIG. 1, the barrier layer(s) 112 in any of FIGS. 5A-5D, 6, 7A-7C, 8A, 8B, 9A, and 9B may be multilayer as in FIG. 4. While FIG. 5A describes a variation to the first and second ohmic source/drain electrodes 102*a*, 102*b* of FIG. 1 in which the bottom surfaces 102*bs* are recessed, the variation is applicable to the first and second ohmic source/drain electrodes 102*a*, 102*b* in any of FIGS. 4, 5B-5D, 6, 7B, 70, 8A, 8B, 9A, and 9B. While FIG. 5B describes a variation to the semiconductor film 104 of FIG. 1 in which the semiconductor film 104 comprises the cap layer 502, the semiconductor film 104 in any of FIGS. 4, 5A, 50, 6, 7A-7C, 8A, 8B, 9A, and 9B may have the cap layer 502. While FIG. 5C describes a variation to the semiconductor film 104 of FIG. 1 in which the channel layer 110 overlies the barrier layer 112 and the 2DCG 106 is a 2DHG 106*h*, this variation is applicable to any of FIGS. 4, 5A, 5B, 6, 7A 7B, 8A, 8B, 9A, and 9B. With regard to FIGS. 8A, 8B, 9A, and 9B, the variation applies to each heterojunction structure 802. While FIG. 5D describes a first variation to the semiconductor film 104 of FIG. 1 in which the channel layer 110 overlies the barrier layer 112 and the 2DCG 106 is a 2DHG 106*h* and further describes a second variation the semiconductor film 104 of FIG. 1 in which the semiconductor film 104 comprises the cap layer 502, the first and second variations are applicable to any of FIGS. 4, 5A, 6, 7A, 7B, 8A, 8B, 9A, and 9B. With regard to FIGS. 8A, 8B, 9A, and 9B, the first variation applies to each of the heterojunction structures 802, whereas the second variation applies to the combination of the heterojunction structures 802. While FIG. 7B describes a variation to the third ohmic source/drain electrode 102*c* of FIG. 6 in which the third ohmic source/drain electrode 102*c* has protrusions 102*p*, the variation is applicable to in any of FIGS. 7A and 7C. While FIG. 7C describes a variation to the semiconductor film 104 of FIG. 6 in which the 2DCG 106 is a 2DHG 106*h*, the variation is applicable to the semiconductor film 104 in any of FIGS. 7A and 7B. While FIGS. 8A, 8B, 9A, and 9B describe the 2DCG 106 as being a 2DEG 106*e*, the 2DEG 106*e* may alternatively be a 2DHG 106*h*. In at least some of such alternative embodiments, the channel layer 110 and the barrier layer 112 of each heterojunction structure 802 are stacked so the barrier layer 112 instead underlies the channel layer 110.

With reference to FIGS. 10-13, a series of cross-sectional views 1000-1300 of some embodiments of a method for forming a 2DCG semiconductor device comprising an ohmic source/drain electrode with a plurality of protrusions protruding from a bottom of the ohmic source/drain electrode. The method may, for example, be employed to form the 2DCG semiconductor device of FIG. 1 or some other suitable 2DCG semiconductor device.

Figure 10:
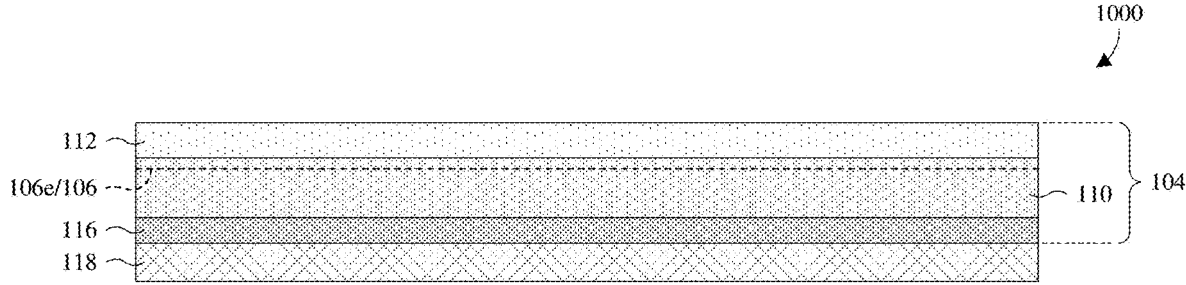
FIGS. 10-13 illustrate a series of cross-sectional views of some embodiments of a method for forming a 2DCG semiconductor device comprising an ohmic source/drain electrode with a plurality of protrusions protruding from a bottom of the ohmic source/drain electrode.

As illustrated by the cross-sectional view 1000 of FIG. 10, a semiconductor film 104 is formed over a substrate 118. The semiconductor film 104 comprises a channel layer 110, a barrier layer 112, and a buffer layer 116 that are vertically stacked. A process for forming the semiconductor film 104 may, for example, comprise sequentially depositing individual layers of the semiconductor film 104 from a bottom of the semiconductor film 104 to a top of the semiconductor film 104 by metal organic chemical vapor deposition (MOCVD) and/or some other suitable deposition process (es). Other suitable processes for forming the semiconductor film 104 are, however, amenable.

The channel layer 110 underlies and directly contacts the barrier layer 112 at a heterojunction and hence has a different bandgap than the barrier layer 112. The barrier layer 112 is polarized so positive charge is shifted towards a bottom surface of the barrier layer 112, and negative charge is shifted towards a top surface of the barrier layer 112. The polarization may, for example, result from spontaneous and/or piezoelectric polarization effects. Because of the polarization, a 2DCG 106 forms in the channel layer 110 and extends along the heterojunction with a high concentration of mobile electrons. Because of the high concentration, the 2DCG 106 is conductive and may also be referred to as a 2DEG 106*e*.

In alternative embodiments, the channel layer 110 overlies and directly contacts the barrier layer 112 at the heterojunction as in FIG. 5C. In such alternative embodiments, the polarization results in the 2DCG 106 having a high concentration of mobile holes instead of mobile electrons. Hence, the 2DCG 106 may also be referred to as a 2DHG in these alternative embodiments. In alternative embodiments, the semiconductor film 104 further comprises a cap layer 502 overlying the channel and barrier layers 110, 112 as in FIG. 5B and/or FIG. 5D. The cap layer 502 may, for example, as described with regard to FIG. 5B and/or FIG. 5D.

The buffer layer 116 separates the channel and barrier layers 110, 112 from the substrate 118. Further, the buffer layer 116 buffers and/or transitions between differences in lattice constants, crystalline structures, thermal expansion coefficients, other suitable parameters, or any combination of the foregoing from the substrate 118 to the channel layer 110. By buffering and/or transitioning between such differences, crystalline quality of the channel and barrier layers 110, 112 may be high and/or stress on the the channel and barrier layers 110, 112 may be low. This may, for example, enhance performance of the 2DCG semiconductor device being formed and/or may reduce failure of the 2DCG semiconductor device.

The channel layer 110, the barrier layer 112, the buffer layer 116, the substrate 118, or any combination of the foregoing may, for example, be as described above with regard to FIG. 1. In some embodiments, the channel layer 110 is undoped and/or is or comprises gallium nitride (e.g., GaN), gallium arsenide (e.g., GaAs), indium phosphide (e.g., InP), some other suitable group III-V material(s), or any combination of the foregoing. In some embodiments, the barrier layer 112 is undoped and/or is or comprises aluminum gallium nitride (e.g., AlGaN), indium aluminum nitride (e.g., InAlN), aluminum nitride (e.g., AlN), aluminum gallium arsenide (e.g., AlGaAs), indium aluminum arsenide (e.g., InAlAs), indium gallium arsenide (e.g., InGaAs), some other suitable group III-V material(s), or any combination of the foregoing. In some embodiments, the buffer layer 116 is or comprises gallium nitride (e.g., GaN), gallium arsenide (e.g., GaAs), indium phosphide (e.g., InP), some other suitable group III-V material(s), or any combination of the foregoing. In some embodiments, the substrate 118 is or comprises silicon, sapphire, some other suitable crystalline material, or any combination of the foregoing. While the channel layer 110, the barrier layer 112, and the buffer layer 116 are described as group III-V materials, group II-VI and other suitable semiconductor materials are, however, amenable.

Figure 11:
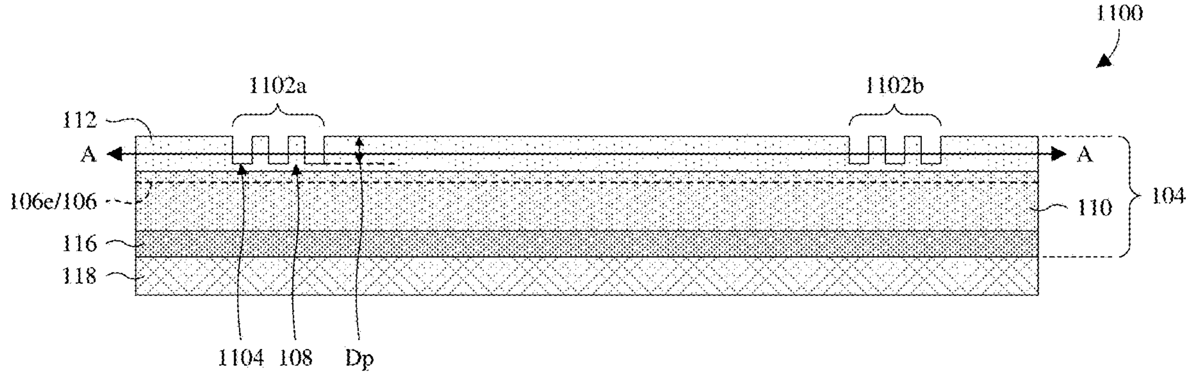

As illustrated by the cross-sectional view 1100 of FIG. 11, a recess etch is performed selectively into the semiconductor film 104 to form a first set 1102*a* of first-level recesses 1104 and a second set 1102*b* of first-level recesses 1104. The first and second sets 1102*a*, 1102*b* are laterally spaced and, as seen hereafter, correspond to source/drain electrodes being formed. The first-level recesses 1104 are separated by gaps 108 and extend into the semiconductor film 104 to a depth Dp. Further, the first-level recesses 1104 extend into the semiconductor film 104 from a top surface of the semiconductor film 104 and are spaced from the heterojunction at which the channel and barrier layers 110, 112 directly contact. In some embodiments, a process for performing the recess etch comprises: 1) forming a mask overlying the semiconductor film 104; 2) performing the recess etch into the semiconductor film 104 with the mask in place; and 3) removing the mask. Other suitable processes are, however, amenable.

In some embodiments, the first-level recesses 1104 have a same top layout as the protrusions 102*p* in FIG. 2, and/or FIG. 11 corresponds to an intermediate state of manufacture towards formation of the 2DCG semiconductor device of FIG. 2, whereby FIG. 2 may be taken along line A in FIG. 11. In other embodiments, the first-level recesses 1104 have a same top layout as the protrusions 102*p* in any of FIGS. 3A-3F or some other suitable top layout. Further, in some embodiments, the first-level recesses 1104 of the first set 1102*a* have a same top layout as the first-level recesses 1104 of the second set 1102*b*. In some embodiments, the first-level recesses 1104 are in a periodic pattern.

Figure 12:
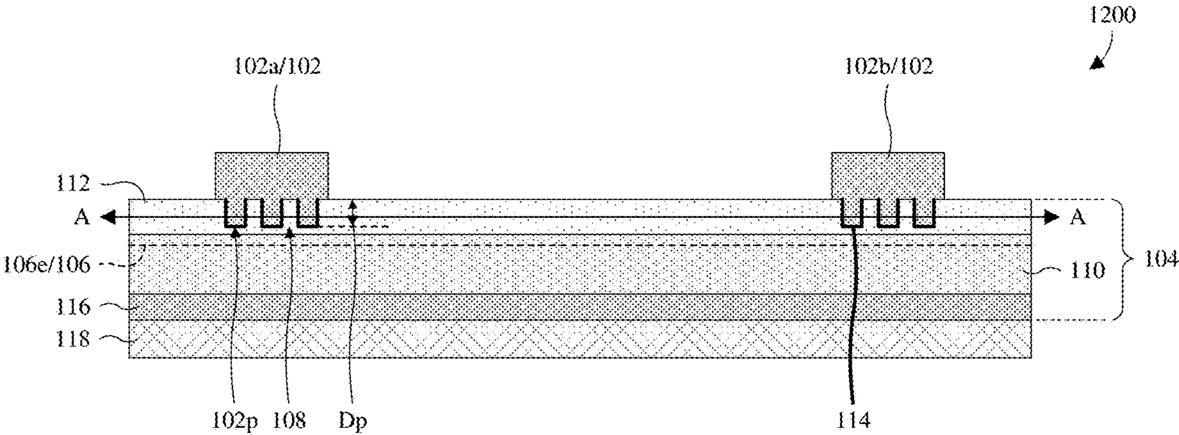

As illustrated by the cross-sectional view 1200 of FIG. 12, a plurality of ohmic source/drain electrodes 102, including a first ohmic source/drain electrode 102*a* and a second ohmic source/drain electrode 102*b*, are formed overlying and ohmically coupled to the 2DCG 106. The ohmic source/drain electrodes 102 correspond to and respectively fill the first and second sets 1102*a*, 1102*b* of first-level recesses 1104. As such, the ohmic source/drain electrodes 102 comprise individual pluralities of protrusions 102*p* extending into the semiconductor film 104. The protrusions 102*p* are separated from each other by the gaps 108 and are individual to and respectively fill the first-level recesses 1104 (see, e.g., FIG. 11).

In some embodiments, a process for forming the ohmic source/drain electrodes 102 comprises: 1) depositing an ohmic metal layer covering the semiconductor film 104; 2) patterning the ohmic metal layer into the ohmic source/drain electrodes 102; and 3) annealing the ohmic source/drain electrodes 102. Other suitable processes are, however, amenable. The patterning may, for example, be performed by a photolithography/etching process or some other suitable patterning process. For example, a mask may be formed overlying the ohmic metal layer, a metal etch may be performed into the ohmic metal layer with the mask in place, and the mask may be removed. The annealing may, for example, reduce contact resistance and/or otherwise enhance performance of the ohmic source/drain electrodes 102.

In some embodiments, the ohmic source/drain electrodes 102 are or comprise titanium, aluminum, nickel, gold, some other suitable metal(s), or any combination of the foregoing. In some embodiments, each of the ohmic source/drain electrodes 102 is or comprises a four-layer stack comprising a titanium layer, an aluminum layer overlying the titanium layer, a nickel layer overlying the aluminum layer, and a gold layer overlying the nickel layer. In other embodiments, each of the ohmic source/drain electrodes 102 comprises a two-layer stack comprising a titanium layer and an aluminum layer overlying the titanium layer.

Because the vertical separation between the 2DCG 106 and the ohmic source/drain electrodes 102 is larger at the gaps 108 than directly under the protrusions 102*p*, density of the 2DCG 106 is larger directly under the gaps 108 than directly under the protrusions 102*p*. Hence, resistance of the 2DCG 106 is smaller directly under the gaps 108 than directly under the protrusions 102*p*. As seen at, for example, FIG. 2, the gaps 108 may extend laterally across the ohmic source/drain electrodes 102 and laterally around the protrusions 102*p*. Therefore, the smaller resistance directly under the gaps 108 may promote current may flow from edges of the protrusions 102*p* on multiple sides of the ohmic source/drain electrodes 102 and hence the effective ohmic contact areas 114 of the ohmic source/drain electrodes 102 may be large.

The large effective ohmic contact areas 114 may decrease current crowding and distribute current flow across the ohmic source/drain electrodes 102. The decreased current crowding and the distributed current flow may increase the area over which heat generated during operation of the 2DCG semiconductor device is spread, which may enhance thermal performance and hence reliability. Further, the large effective ohmic contact areas 114 may lead to low contact resistance from the ohmic source/drain electrodes 102 to the 2DCG 106.

Because of the large effective ohmic contact areas 114, a depth Dp to which the protrusions 102*p* extend into the semiconductor film 104 may be decreased while still maintaining low contact resistances. Etching uniformity generally decreases as depth increases and generally increases as depth decreases. The decreased depth may, in turn, increase etching uniformity while performing the recess etch described with regard to FIG. 11. Further, because of the larger vertical separation at the gaps 108, and because the etching is not performed at the gaps 108, current flow directly under the gaps may be unaffected or minimally affected by nonuniformity in the etching. Because the current flow may be unaffected or minimally affected by the nonuniformity, the contact resistance may be unaffected or minimally affected by the nonuniformity and yields may be high.

Figure 13:
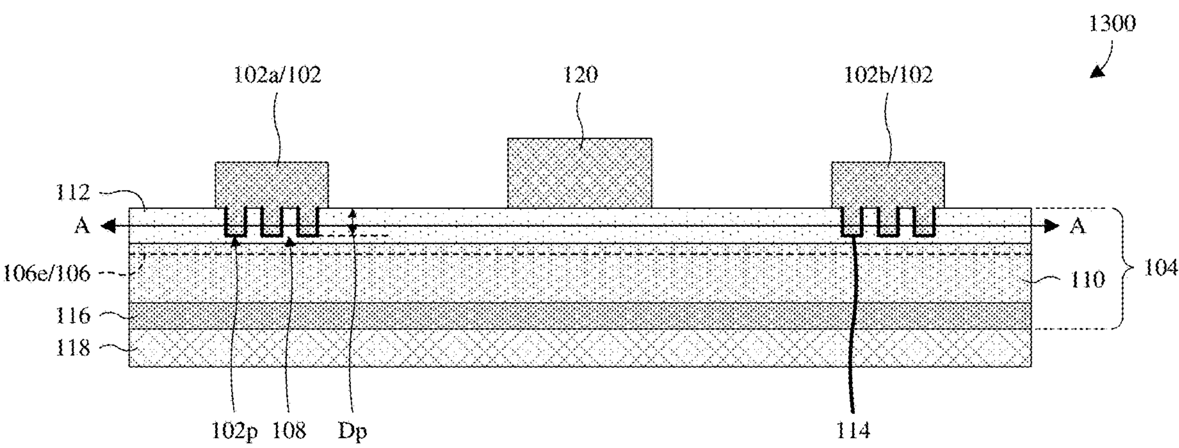

As illustrated by the cross-sectional view 1300 of FIG. 13, a gate electrode 120 is formed overlying the semiconductor film 104, laterally between the ohmic source/drain electrodes 102. In some embodiments, a process for forming the gate electrode 120 comprises: 1) depositing a gate electrode layer; and 2) patterning the gate electrode layer into the gate electrode 120. Other suitable processes are, however, amenable. In some embodiments, the gate electrode 120 is or comprises nickel, gold, platinum, iridium, titanium nitride, aluminum copper, palladium, some other suitable metal(s) and/or metallic material(s), or any combination of the foregoing.

While FIGS. 10-13 are described with reference to a method, it will be appreciated that the structures shown in FIGS. 10-13 are not limited to the method but rather may stand alone separate of the method. While FIGS. 10-13 are described as a series of acts, it will be appreciated that the order of the acts may be altered in other embodiments. While FIGS. 10-13 illustrate and describe as a specific set of acts, some acts that are illustrated and/or described may be omitted in other embodiments. Further, acts that are not illustrated and/or described may be included in other embodiments.

Figure 14:
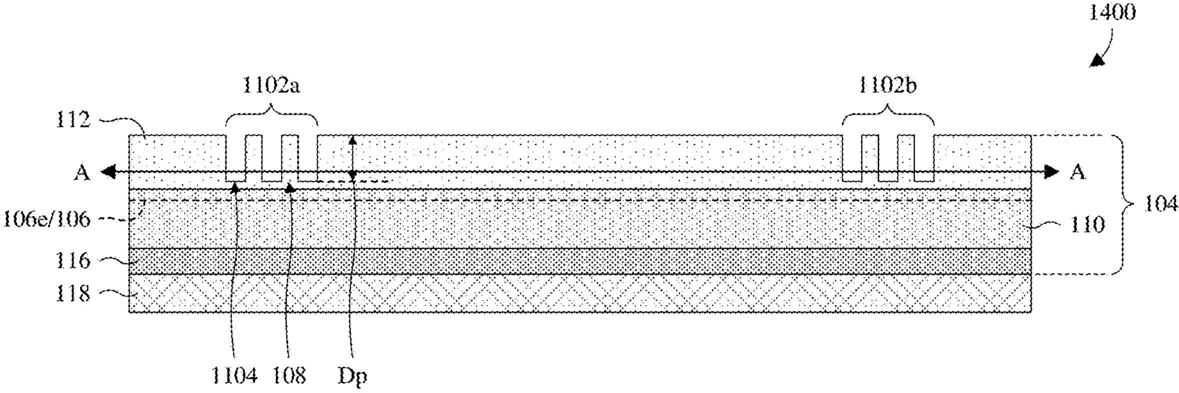
FIGS. 14-16 illustrate a series of cross-sectional views of some alternative embodiments of the method of FIGS. 10-13.
Figure 15:
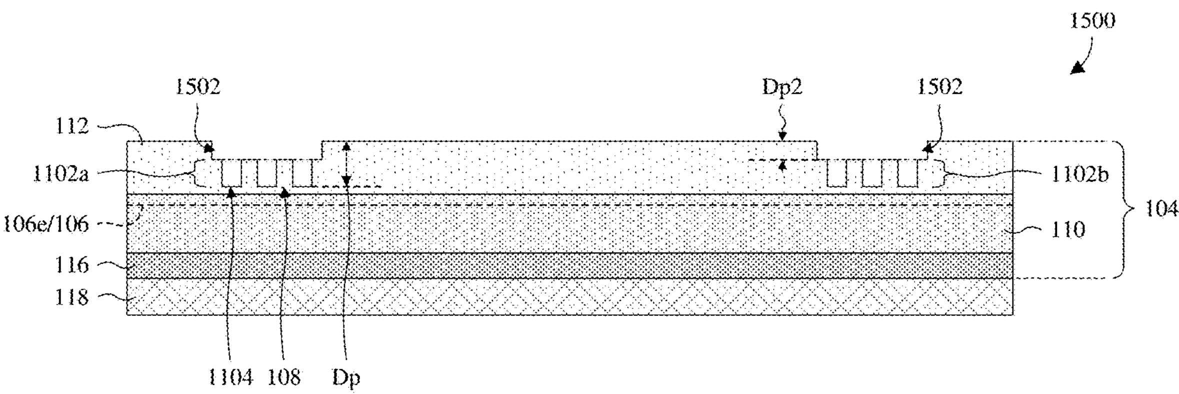
Figure 16:
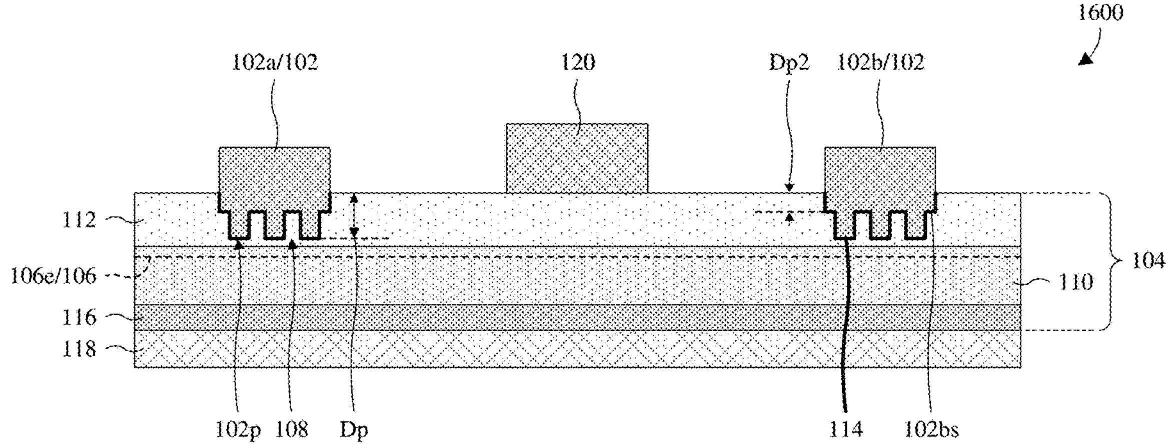

With reference to FIG. 14-16, a series of cross-sectional views 1400-1600 of some alternative embodiments of the method of FIGS. 10-13 is provided in which the protrusions protrude into a semiconductor film from a bottom surface of the ohmic source/drain electrode that is recessed relative to a top surface of a semiconductor film. The method may, for example, be employed to form the 2DCG semiconductor device of FIG. 5A or some other suitable 2DCG semiconductor device.

As illustrated by the cross-sectional view 1400 of FIG. 14, the acts described with regard to FIGS. 10 and 11 are performed. A semiconductor film 104 is formed over a substrate 118 as described with regard to FIG. 10. Further, a recess etch is performed selectively into the semiconductor film 104 to form a first set 1102*a* of first-level recesses 1104 and a second set 1102*b* of first-level recesses 1104 as described with regard to FIG. 11.

As illustrated by the cross-sectional view 1500 of FIG. 15, a second recess etch is performed selectively into the semiconductor film 104 to form a plurality of second-level recesses 1502. In alternative embodiments, the second recess etch is performed before the recess etch. The second-level recesses 1502 are individual to and respectively overlap with the first and second sets 1102*a*, 1102*b* of first-level recesses 1104. Further, the second-level recesses 1502 extend into the semiconductor film 104 to a depth Dp2, which is less than the depth Dp to which the first-level recesses 1104 extend into the semiconductor film 104. In some embodiments, the second-level recesses 1502 completely cover the first-level recesses 1104. In some embodiments, a process for performing the second recess etch comprises: 1) forming a mask overlying the semiconductor film 104; 2) performing the second recess etch into the semiconductor film 104 with the mask in place; and 3) removing the mask. Other suitable processes are, however, amenable.

As illustrated by the cross-sectional view 1600 of FIG. 16, the acts described with regard to FIGS. 12 and 13 are performed. A plurality of ohmic source/drain electrodes 102 are formed overlying the semiconductor film 104, and further filling the first and second sets 1102*a*, 1102*b* of first-level recesses 1104 and the second-level recesses 1502, as described with regard to FIG. 12. Further, a gate electrode 120 is formed overlying the semiconductor film 104, laterally between the ohmic source/drain electrodes 102, as described with regard to FIG. 13. Because of the second-level recesses 1502, the bottom surfaces 102*bs* from which the protrusions 102*p* extend are recessed relative to a top surface of the semiconductor film 104. Further, the effective ohmic contact areas 114 of the ohmic source/drain electrodes 102 are increased and hence contact resistances of the ohmic source/drain electrodes 102 are decreased.

While FIGS. 14-16 are described with reference to a method, it will be appreciated that the structures shown in FIGS. 14-16 are not limited to the method but rather may stand alone separate of the method. While FIGS. 14-16 are described as a series of acts, it will be appreciated that the order of the acts may be altered in other embodiments. While FIGS. 14-16 illustrate and describe as a specific set of acts, some acts that are illustrated and/or described may be omitted in other embodiments. Further, acts that are not illustrated and/or described may be included in other embodiments.

Figure 17:
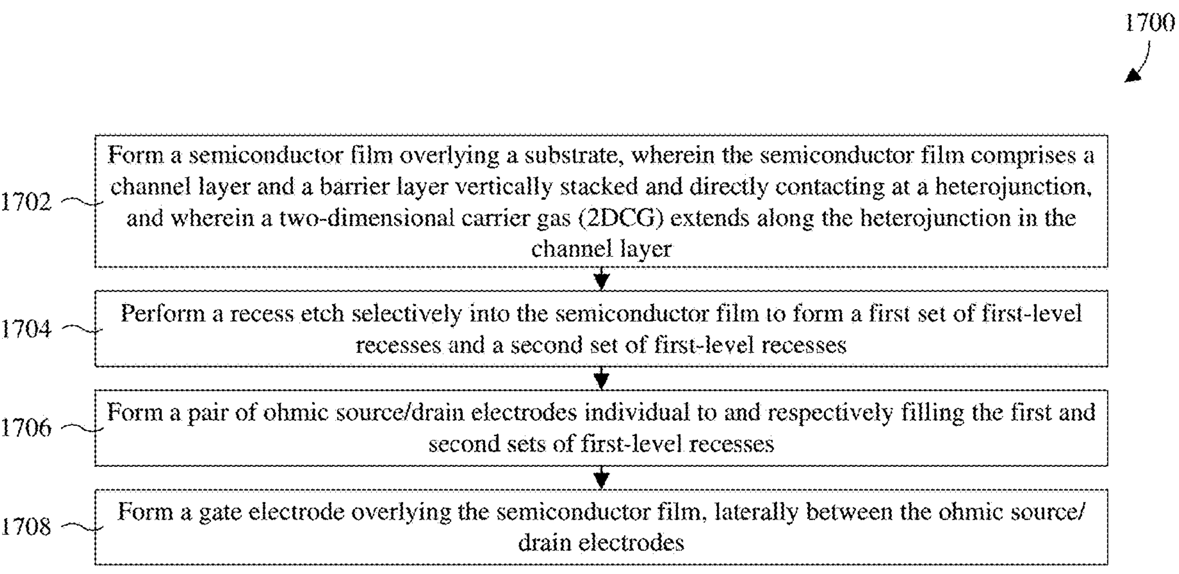
FIG. 17 illustrates a block diagram of some embodiments of the method of FIGS. 10-13.

With reference to FIG. 17, a block diagram 1700 of some embodiments of the method of FIGS. 10-13 is provided.

At 1702, a semiconductor film is formed overlying a substrate, wherein the semiconductor film comprises a channel layer and a barrier layer vertically stacked and directly contacting at a heterojunction, and wherein a 2DCG extends along the heterojunction in the channel layer. See, for example, FIG. 10.

At 1704, a recess etch is performed selectively into the semiconductor film to form a first set of first-level recesses and a second set of first-level recesses. Sec, for example, FIG. 11. In some embodiments, a second recess etch is performed selectively into the semiconductor film to form a plurality of second-level recesses individual to and respectively overlying with the first and second sets of the first-level recesses. See, for example, FIG. 15.

At 1706, a pair of ohmic source/drain electrodes is formed, wherein the ohmic source/drain electrodes are individual to and respectively fill the first and second sets of first-level recesses. See, for example, FIG. 12.

At 1708, a gate electrode is formed overlying the semiconductor film, laterally between the ohmic source/drain electrodes. See, for example, FIG. 13.

While the block diagram 1700 of FIG. 17 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

With reference to FIGS. 18-23, a series of cross-sectional views 1800-2300 of some embodiments of a method for forming a vertical 2DCG semiconductor device comprising an ohmic source/drain electrode with a plurality of protrusions protruding from a bottom of the ohmic source/drain electrode. The method may, for example, be employed to form the 2DCG semiconductor device of FIG. 6 or some other suitable 2DCG semiconductor device.

Figure 18:
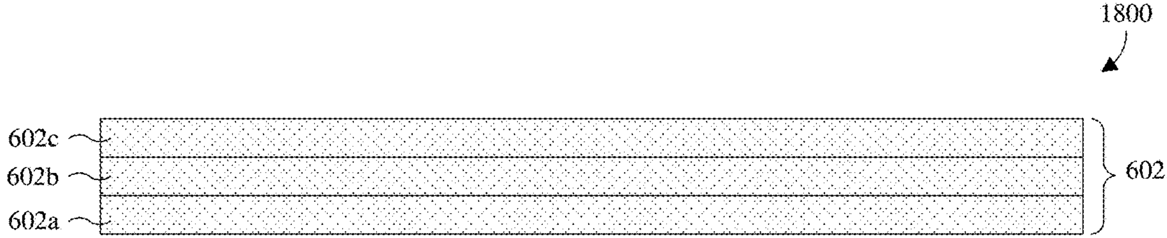
FIGS. 18-23 illustrate a series of cross-sectional views of some embodiments of a method for forming a vertical 2DCG semiconductor device comprising an ohmic source/drain electrode with a plurality of protrusions protruding from a bottom of the ohmic source/drain electrode.

As illustrated by the cross-sectional view 1800 of FIG. 18, a drift layer 602 is formed. The drift layer 602 is a doped semiconductor layer and comprises a first doped layer 602*a*, a second doped layer 602*b* overlying the first doped layer 602*a*, and a third doped layer 602*c* overlying the second doped layer 602*b*. The first, second, and third doped layers 602*a*-602*c* share a common material but have different doping concentrations. For example, the first doped layer 602*a* may have a greater doping concentration than the third doped layer 602*c*, which may have a greater doping concentration than the second doped layer 602*b*.

In some embodiments, the drift layer 602 is or comprise gallium nitride (e.g., GaN), gallium arsenide (e.g., GaAs), indium phosphide (e.g., InP), some other suitable group III-V material(s), or any combination of the foregoing. In at least some embodiments in which the subsequently formed 2DCG is a 2DEG, the drift layer 602 is doped with an n-type donor impurity. For example, in at least some embodiments in which the semiconductor film 104 is based on gallium nitride, the drift layer 602 may be doped with silicon, carbon, or some other suitable type of n-type donor impurity. In at least some embodiments in which the subsequently formed 2DCG is a 2DHG, the drift layer 602 is doped with an p-type acceptor impurity.

Figure 19:
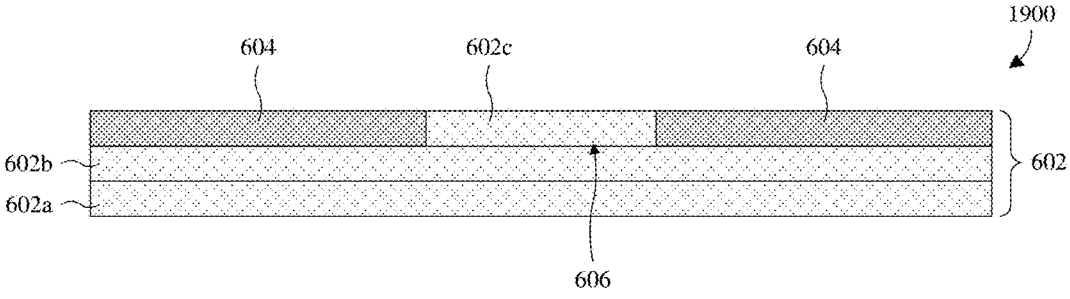

As illustrated by the cross-sectional view 1900 of FIG. 19, a CBL 604 is formed overlying and inset into a top of the drift layer 602. Further, the CBL 604 has an aperture 606 through which the drift layer 602 may extend. The CBL 604 is configured to block current flow for the vertical 2DCG semiconductor being formed.

In some embodiments, a process for forming the CBL 604 comprises selectively doping a portion of the drift layer 602 with: 1) dopants having an opposite doping type (e.g., n-type vs. p-type) as the drift layer 602; and/or 2) dopants that increase a bandgap of the drift layer 602. For example, when the drift layer 602 is n-type and the drift layer 602 is or comprises gallium nitride, the drift layer 602 may be selectively doped with magnesium or other suitable p-type dopants. As another example, when the drift layer 602 is n-type and the drift layer 602 is or comprises gallium nitride, the drift layer 602 may be doped with aluminum or some other suitable material configured to increase a bandgap of n-type gallium nitride. The doping may, for example, be performed selectively by: 1) forming a mask overlying the drift layer 602; 2) doping the drift layer 602 with the mask in place; and 3) removing the mask. Notwithstanding the foregoing approach to forming the CBL 604, other suitable processes are, however, amenable.

Figure 20:
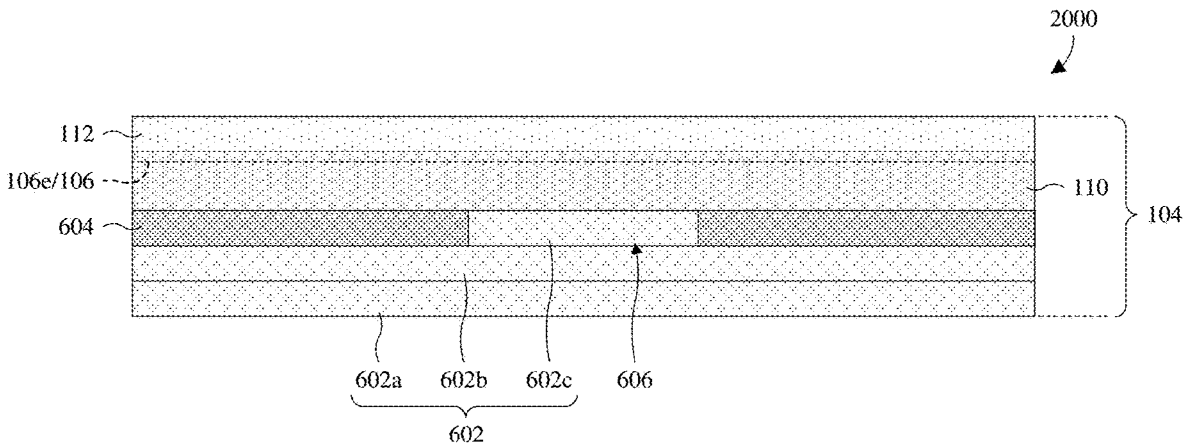

As illustrated by the cross-sectional view 2000 of FIG. 20, a channel layer 110 and a barrier layer 112 are formed vertically stacked over the drift layer 602 and the CBL 604. Collectively, the channel layer 110, the barrier layer 112, the drift layer 602, and the CBL 604 form a semiconductor film 104. A process for forming the channel and barrier layers 110, 112 may, for example, comprise sequentially depositing the channel and barrier layers 110, 112 by MOCVD and/or some other suitable deposition process(es). Other suitable processes for forming the channel and barrier layers 110, 112 are, however, amenable.

The channel layer 110 underlies and directly contacts the barrier layer 112 at a heterojunction and hence has a different bandgap than the barrier layer 112. The barrier layer 112 is polarized so positive charge is shifted towards a bottom surface of the barrier layer 112, and negative charge is shifted towards a top surface of the barrier layer 112. Because of the polarization, a 2DCG 106 forms in the channel layer 110 and extends along the heterojunction with a high concentration of mobile electrons. Because of the high concentration, the 2DCG 106 is conductive and may also be referred to as a 2DEG 106*e*.

In alternative embodiments, the channel layer 110 overlies and directly contacts the barrier layer 112 at the heterojunction as in FIG. 7C. In such alternative embodiments, the polarization results in the 2DCG 106 having a high concentration of mobile holes instead of mobile electrons. Hence, the 2DCG 106 may also be referred to as a 2DHG in these alternative embodiments. In alternative embodiments, the semiconductor film 104 further comprises a cap layer 502 overlying the channel and barrier layers 110, 112 as in FIG. 5B and/or FIG. 5D. The cap layer 502 may, for example, be as described with regard to FIG. 5B and/or FIG. 5D.

Figure 21:
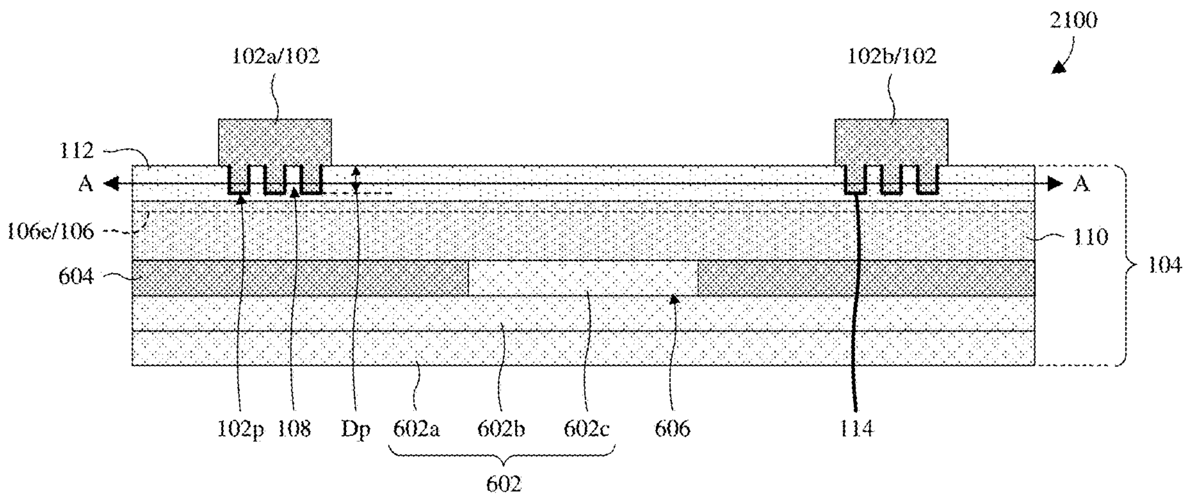

As illustrated by the cross-sectional view 2100 of FIG. 21, the acts described with regard to FIGS. 11 and 12 are performed. A recess etch is performed selectively into the semiconductor film 104 to form a first set 1102*a* of first-level recesses 1104 and a second set 1102*b* of first-level recesses 1104 as described with regard to FIG. 11. A plurality of ohmic source/drain electrodes 102 are formed overlying the semiconductor film 104, and further filling the first and second sets 1102*a*, 1102*b* of first-level recesses 1104, as described with regard to FIG. 12. In alternative embodiments, a second recess etch is performed selectively into the semiconductor film 104 to form a plurality of second-level recesses 1502 as described with regard to FIG. 15. The second recess etch may be performed before the recess etch or between the recess etch and the forming of the ohmic source/drain electrodes 102.

Figure 22:
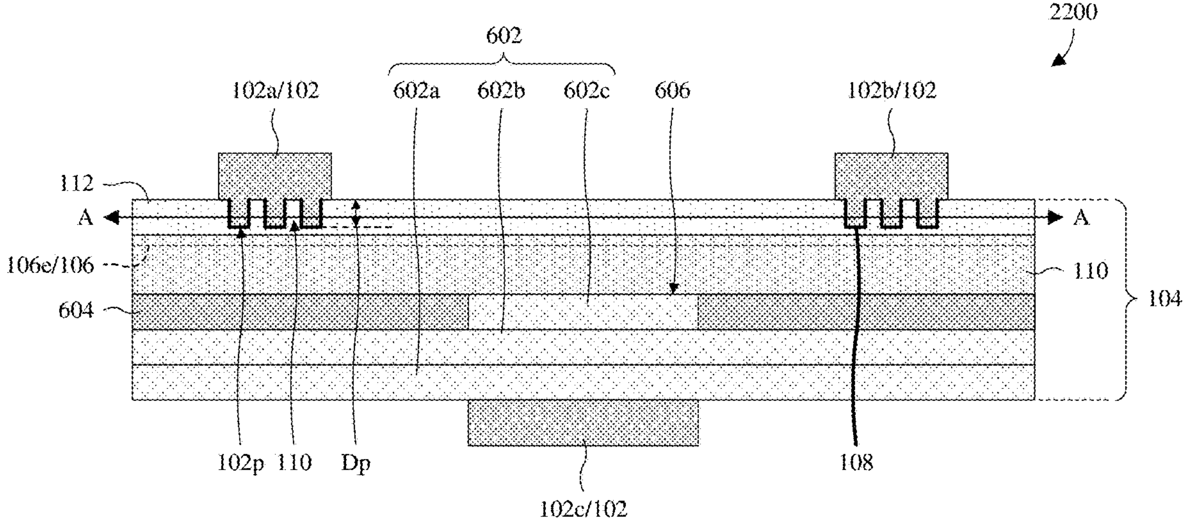

As illustrated by the cross-sectional view 2200 of FIG. 22, a third ohmic source/drain electrode 102*c* of the ohmic source/drain electrodes 102 is formed underlying the aperture 606 on an underside of the semiconductor film 104. The third ohmic source/drain electrode 102*c* is as the first and second ohmic source/drain electrodes 102*a*, 102*b* are described, except that the third ohmic source/drain electrode 102*c* does not have protrusions. In alternative embodiments, the third ohmic source/drain electrode 102*c* has protrusions as in FIG. 7B. Further, the third ohmic source/drain electrode 102*c* may, for example, be formed as described for the first and second ohmic source/drain electrodes 102*a*, 102*b* with regard to FIG. 12.

Figure 23:
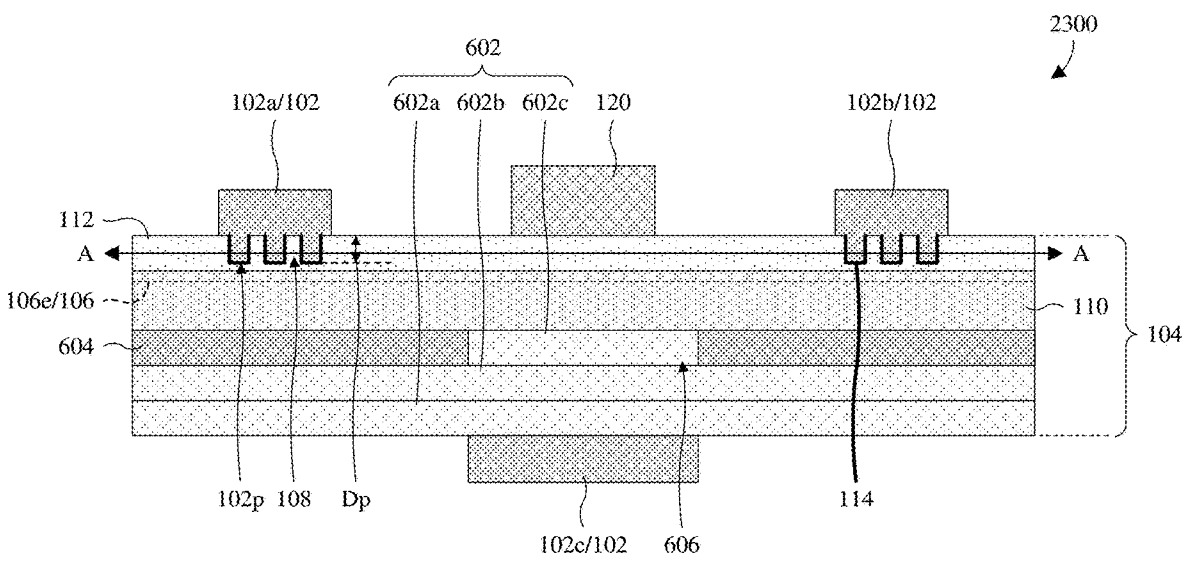

As illustrated by the cross-sectional view 2300 of FIG. 23, the acts described with regard to FIG. 13 are performed to form a gate electrode 120 overlying the semiconductor film 104, laterally between the first and second ohmic source/drain electrodes 102*a*, 102*b*.

While FIGS. 18-23 are described with reference to a method, it will be appreciated that the structures shown in FIGS. 18-23 are not limited to the method but rather may stand alone separate of the method. While FIGS. 18-23 are described as a series of acts, it will be appreciated that the order of the acts may be altered in other embodiments. While FIGS. 18-23 illustrate and describe as a specific set of acts, some acts that are illustrated and/or described may be omitted in other embodiments. Further, acts that are not illustrated and/or described may be included in other embodiments.

With reference to FIGS. 24-27, a series of cross-sectional views 2400-2700 of some embodiments of a multi-channel 2DCG semiconductor device comprising an ohmic source/drain electrode with a plurality of protrusions protruding from a bottom of the ohmic source/drain electrode is provided. The method may, for example, be employed to form the multi-channel 2DCG semiconductor device of FIGS. 8A and 8B.

Figure 24:
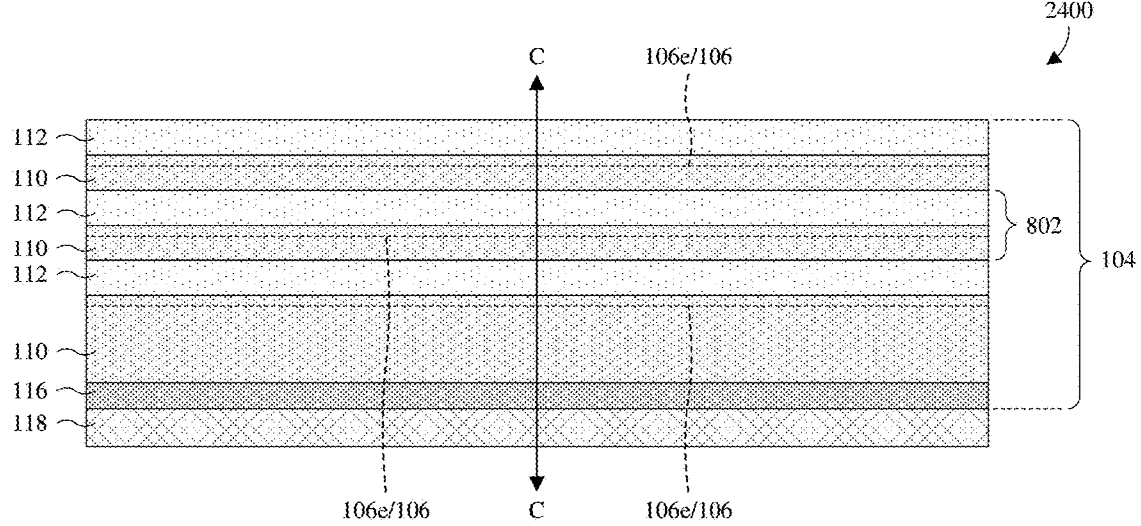
FIGS. 24-27 illustrate a series of cross-sectional view of some embodiments of a multi-channel 2DCG semiconductor device comprising an ohmic source/drain electrode with a plurality of protrusions protruding from a bottom of the ohmic source/drain electrode.

As illustrated by the cross-sectional view 2400 of FIG. 24, a semiconductor film 104 is formed over a substrate 118. The semiconductor film 104 forms a fin structure outside the cross-sectional view 2400. However, the fin structure may, for example, be as the fin structure 104*f* of FIG. 8B, and/or FIG. 24 may correspond to an intermediate state of manufacture towards formation of the multi-channel 2DCG semiconductor device of FIG. 8B, whereby FIG. 8B may be taken along line C in FIG. 24. Further, the semiconductor film 104 comprises a buffer layer 116 and a plurality of heterojunction structures 802 vertically stacked over the buffer layer 116. The buffer layer 116 buffers and/or transitions between differences in lattice constants, crystalline structures, thermal expansion coefficients, other suitable parameters, or any combination of the foregoing from the substrate 118 to the heterojunction structures 802.

The heterojunction structures 802 comprise individual channel layers 110 and individual barrier layers 112. The channel layers 110 underlie and directly contact the corresponding barrier layers 112 at heterojunctions. The barrier layers 112 are polarized so positive charge is shifted towards bottom surfaces of the barrier layers 112. Because of the polarization, the 2DCGs 106 form in the channel layers 110. The 2DCGs 106 extend respectively along the heterojunctions and have a high concentration of mobile electrons. Because of the high concentration, the 2DCGs 106 may also be referred to as a 2DEGs 106*e*.

In alternative embodiments, the channel layers 110 overlie and directly contact the corresponding barrier layers 112 at heterojunctions. In such alternative embodiments, the polarization results in the 2DCG 106 having a high concentration of mobile holes instead of mobile electrons. Hence, the 2DCG 106 may also be referred to as a 2DHG in these alternative embodiments. In alternative embodiments, the semiconductor film 104 further comprises a cap layer 502 overlying the channel and barrier layers 110, 112 as in FIG. 5B and/or FIG. 5D. The cap layer 502 may, for example, as described with regard to FIG. 5B and/or FIG. 5D.

A process for forming the semiconductor film 104 may, for example, comprise: 1) sequentially depositing individual layers of the semiconductor film 104 from a bottom of the semiconductor film 104 to a top of the semiconductor film 104; 2) subsequently patterning the semiconductor film 104 into a fin structure. Other suitable processes for forming the semiconductor film 104 are, however, amenable. The depositing may, for example, be performed by MOCVD and/or some other suitable deposition process(es). The patterning may, for example, be performed by a photolithography/etching process and/or some other suitable patterning process.

Figure 25:
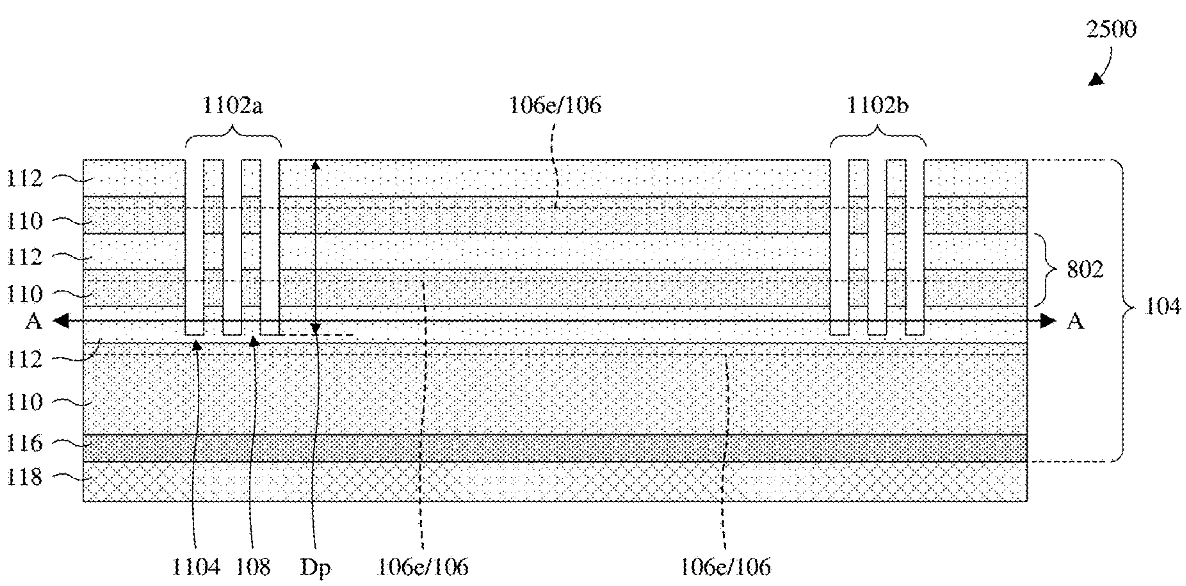
Figure 26:
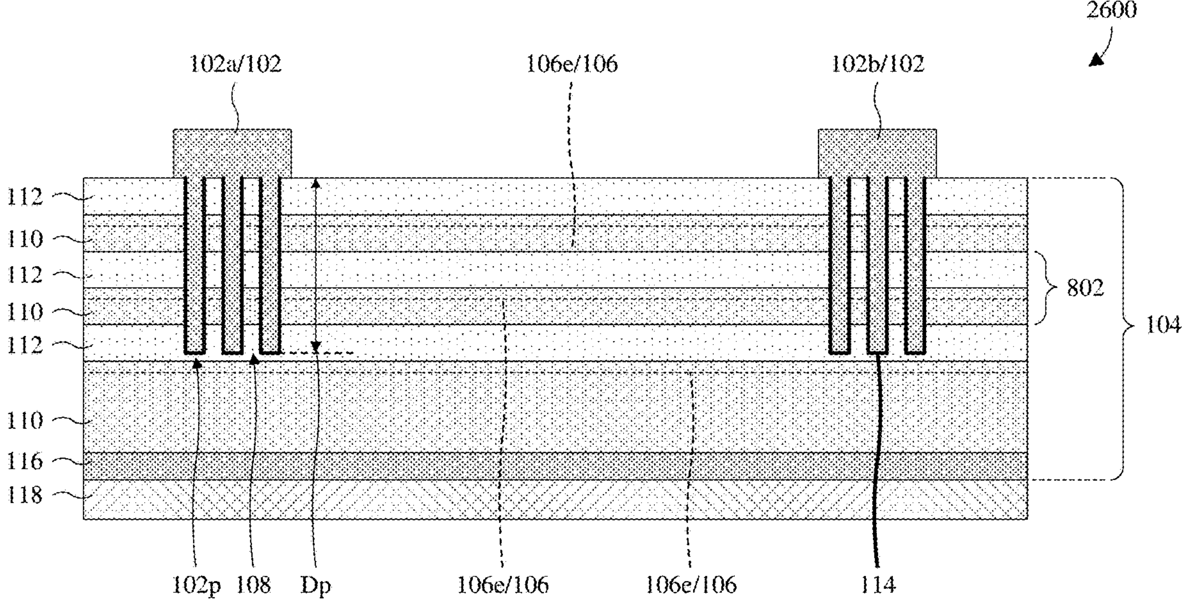

As illustrated by the cross-sectional views 2500, 2600 of FIGS. 25 and 26, the acts described with regard to FIGS. 11 and 12 are respectively performed. At FIG. 25, a recess etch is performed selectively into the semiconductor film 104 to form a first set 1102*a* of first-level recesses 1104 and a second set 1102*b* of first-level recesses 1104 as described with regard to FIG. 11. At FIG. 26, a plurality of ohmic source/drain electrodes 102 are formed overlying the semiconductor film 104 and filling the first and second sets 1102*a*, 1102*b* of first-level recesses 1104 as described with regard to FIG. 12. In alternative embodiments, a second recess etch is performed selectively into the semiconductor film 104 to form a plurality of second-level recesses 1502 as described with regard to FIG. 15. The second recess etch may be performed before the recess etch or between the recess etch and the forming of the ohmic source/drain electrodes 102.

Because the protrusions 102*p* are separated by gaps 108, the first-level recesses 1104 and hence the protrusions 102*p* may extend through the 2DCGs 106 without breaking the continuity of the 2DCGs 106 laterally across the ohmic source/drain electrodes 102. This is more readily seen in, for example, FIG. 2, which may be taken along line A in FIG. 26.

Figure 27:
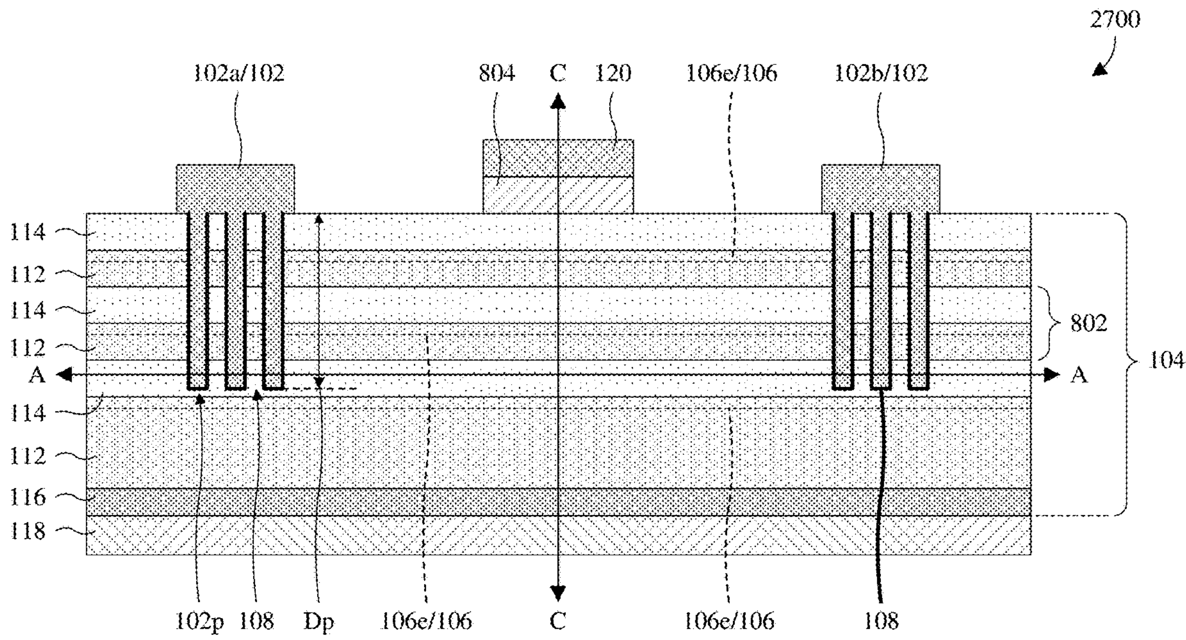

As illustrated by the cross-sectional view 2700 of FIG. 27, a gate dielectric layer 804 and a gate electrode 120 are formed overlying the semiconductor film 104 and straddling the fin structure 104*f* (see, e.g., FIG. 8B) formed by the semiconductor film 104. In some embodiments, a process for forming the gate dielectric layer 804 and the gate electrode 120 comprises: 1) depositing a dielectric layer; 2) depositing a gate electrode layer over the dielectric layer; and 3) patterning the dielectric layer and the gate electrode layer respectively into the gate dielectric layer 804 and the gate electrode 120. Other suitable processes are, however, amenable.

While FIGS. 24-27 are described with reference to a method, it will be appreciated that the structures shown in FIGS. 24-27 are not limited to the method but rather may stand alone separate of the method. While FIGS. 24-27 are described as a series of acts, it will be appreciated that the order of the acts may be altered in other embodiments. While FIGS. 24-27 illustrate and describe as a specific set of acts, some acts that are illustrated and/or described may be omitted in other embodiments. Further, acts that are not illustrated and/or described may be included in other embodiments.

In some embodiments, the present disclosure provides a semiconductor device including: a semiconductor film including a channel layer and a barrier layer, wherein the channel and barrier layers are vertically stacked and contact at a heterojunction; a 2DCG in the channel layer and extending laterally along the heterojunction; a first source/drain electrode and a second source/drain electrode overlying and ohmically coupled to the 2DCG; and a gate electrode overlying the semiconductor film and laterally between the first and second source/drain electrodes; wherein the first source/drain electrode has a plurality of first protrusions protruding into the semiconductor film from a bottom surface of the first source/drain electrode. In some embodiments, the first protrusions are in a periodic pattern from a first side of the first source/drain electrode to a second side of the first source/drain electrode opposite the first side. In some embodiments, the first protrusions are in a plurality of rows and a plurality of columns. In some embodiments, the first protrusions are spaced from the heterojunction. In some embodiments, the bottom surface is level with a top surface of the semiconductor film. In some embodiments, the bottom surface is recessed relative to a top surface of the semiconductor film. In some embodiments, the barrier layer and the channel layer include group III-V materials. In some embodiments, the semiconductor film includes a cap layer overlying the channel and barrier layers, wherein the first protrusions protrude into the cap layer and are spaced from the channel and barrier layers. In some embodiments, the first protrusions protrude into the barrier layer and are spaced from the channel layer.

In some embodiments, the present disclosure provides another semiconductor device including: a channel layer; a barrier layer vertically stacked with and directly contacting the channel layer; a 2DCG in the channel layer and extending laterally along an interface at which the barrier and channel layers directly contact; a first source/drain electrode and a second source/drain electrode overlying and ohmically coupled to the 2DCG; and a gate electrode overlying the 2DCG and laterally between the first and second source/drain electrodes; wherein the first source/drain electrode has a first vertical separation and a second vertical separation from the 2DCG, wherein the second vertical separation is greater than the first vertical separation, and wherein the first source/drain electrode has the second vertical separation continuously from a first side of the first source/drain electrode that faces the second source/drain electrode to a second side of the first source/drain electrode opposite the first side. In some embodiments, a bottom of the first source/drain electrode has a gap with a periodic pattern. In some embodiments, the first vertical separation is directly under a pair of bottom protrusions of the first source/drain electrode, wherein the second vertical separation is at a gap separating the bottom protrusions. In some embodiments, the barrier layer and the channel layer at least partially form a fin structure, wherein the gate electrode straddles the fin structure and extends along opposite sidewalls of the fin structure. In some embodiments, the channel and barrier layers form a heterojunction structure repeating multiple times in a vertical stack, wherein the vertical stack at least partially forms the fin structure, and wherein the gate electrode extends along sidewalls of each heterojunction structure in the vertical stack. In some embodiments, the semiconductor device further includes: a semiconductor drift layer underlying the channel and barrier layers; a current blocking layer inset into a top of the semiconductor drift layer, vertically between the semiconductor drift layer and the channel and barrier layers, wherein the current blocking layer has an aperture underlying the gate electrode; and a third source/drain electrode underlying the aperture on an underside of the semiconductor drift layer.

In some embodiments, the present disclosure provides a method for forming a semiconductor device, the method including: forming a semiconductor film including a channel layer and a barrier layer that are vertically stacked and directly contact at a heterojunction, wherein a 2DCG is in the channel layer and extends laterally along the heterojunction; performing a first etch selectively into the semiconductor film to form a plurality of first-level recesses, wherein the first-level recesses have a periodic pattern; forming a first source/drain electrode and a second source/drain electrode, wherein the first and second source/drain electrodes are laterally spaced and ohmically coupled to the 2DCG, and wherein the first source/drain electrode fills the plurality of first-level recesses; and forming a gate electrode overlying the semiconductor film, laterally between the first and second source/drain electrodes. In some embodiments, the method further includes performing a second etch into the semiconductor film to form a second-level recess; wherein the plurality of first-level recesses and the second-level recess overlap, and wherein the first etch extends into the semiconductor film to a depth greater than that of the second etch. In some embodiments, the forming of the first source/drain electrode includes depositing ohmic metal, wherein the semiconductor film has individual sidewalls in the first-level recesses that extend from a top surface of the semiconductor film to a bottom of the first-level recesses during the depositing. In some embodiments, the method further includes: forming a semiconductor drift layer; selectively doping a top portion of the semiconductor drift layer to form a current blocking layer overlying the semiconductor drift layer, wherein the current blocking layer has an aperture at which the top portion was not doped by the selective doping; and forming a third source/drain electrode directly under the aperture; wherein the channel and barrier layers are formed over the semiconductor drift layer and the current blocking layer, wherein the gate electrode is formed directly over the aperture, and wherein the first and second source/drain electrodes are formed directly over the current blocking layer. In some embodiments, the forming of the semiconductor film includes repeatedly and alternatingly depositing the channel layer and the barrier layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:

a semiconductor film comprising a channel layer and a barrier layer, wherein the channel and barrier layers are vertically stacked and contact at a heterojunction;

a two-dimensional carrier gas (2DCG) in the channel layer and extending laterally along the heterojunction;

a first source/drain electrode and a second source/drain electrode overlying and ohmically coupled to the 2DCG;

a gate electrode overlying the semiconductor film and laterally between the first and second source/drain electrodes;

a semiconductor drift layer underlying the semiconductor film;

a current blocking layer underlying the semiconductor film and overlying and recessed into the semiconductor drift layer; and a third source/drain electrode underlying the semiconductor drift layer;

wherein the first source/drain electrode has a plurality of protrusions protruding downward into the semiconductor film, wherein the semiconductor drift layer has a protrusion protruding upward through the current blocking layer, and wherein the protrusion of the semiconductor drift layer covers the third source/drain electrode and has a topmost surface level with a topmost surface of the current blocking layer.

2. The semiconductor device according to claim 1, wherein a width of the third source/drain electrode is closer to a width of the protrusion of the semiconductor drift layer than to a separation between the first and second source/drain electrodes.

3. The semiconductor device according to claim 1, wherein the gate electrode is directly over the protrusion of the semiconductor drift layer and the third source/drain electrode.

4. The semiconductor device according to claim 1, wherein the topmost surface of the protrusion of the semiconductor drift layer and the topmost surface of the current blocking layer directly contact the channel layer, and wherein the semiconductor drift layer directly contacts the third source/drain electrode.

5. The semiconductor device according to claim 1, wherein the semiconductor drift layer comprises a first doped layer and a second doped layer overlying the first doped layer, and wherein the protrusion of the semiconductor drift layer protrudes upward from a top of the second doped layer and further has a greater doping concentration than the second doped layer and a lesser doping concentration than the first doped layer.

6. The semiconductor device according to claim 1, wherein the protrusion of the semiconductor drift layer and the current blocking layer share a common height and have opposite doping types.

7. The semiconductor device according to claim 1, wherein the third source/drain electrode has an additional plurality of protrusions directly under the gate electrode and protruding into the semiconductor drift layer.

8. A semiconductor device, comprising:

a semiconductor film comprising a first two-dimensional carrier gas (2DCG) and a second 2DCG overlying the first 2DCG;

a first source/drain electrode and a second source/drain electrode laterally spaced from each other and overlying and ohmically coupled to the first and second 2DCGs; and a gate electrode overlying the first and second 2DCGs and laterally between the first and second source/drain electrodes;

wherein the semiconductor film forms a fin structure, wherein the first source/drain electrode has a plurality of protrusions protruding downward into the fin structure, wherein the gate electrode has a pair of leg portions, which extend downward along opposite sidewalls of the fin structure and which have individual bottom surfaces elevated relative to the first 2DCG and recessed relative to the second 2DCG.

9. The semiconductor device according to claim 8, wherein the plurality of protrusions have individual bottom surfaces elevated relative to the first 2DCG and recessed relative to the second 2DCG.

10. The semiconductor device according to claim 9, wherein the semiconductor film comprises a first channel layer and a first barrier layer that overlies the first channel layer, wherein the first 2DCG is in the first channel layer, and wherein the individual bottom surfaces of the plurality of protrusions are in the first barrier layer and are spaced from the first channel layer.

11. The semiconductor device according to claim 8, wherein the plurality of protrusions have individual bottom surfaces that are elevated relative to the individual bottom surfaces of the pair of leg portions.

12. The semiconductor device according to claim 8, wherein the gate electrode is laterally between the first and second source/drain electrodes in a first dimension, wherein the semiconductor film forms an additional fin structure laterally offset from the fin structure in a second dimension orthogonal to the first dimension, and wherein the gate electrode is continuous from directly over the fin structure to directly over the additional fin structure.

13. The semiconductor device according to claim 8, further comprising:

a gate dielectric layer separating the gate electrode from the fin structure, wherein a bottom surface of the gate dielectric layer is recessed relative to the first 2DCG.

14. The semiconductor device according to claim 8, wherein the semiconductor film comprises a first channel layer, a first barrier layer that overlies the first channel layer, a second channel layer that overlies the first barrier layer, and a second barrier layer that overlies the second channel layer, wherein the first 2DCG and the second 2DCG are respectively in the first channel layer and the second channel layer, and wherein a thickness of the first channel layer is greater than a thickness of the second channel layer.

15. The semiconductor device according to claim 8, wherein the semiconductor film comprises a first channel layer and a first barrier layer that overlies the first channel layer, wherein the first 2DCG is in the first channel layer, and wherein the individual bottom surfaces of the pair of leg portions are directly over the first channel layer.

16. The semiconductor device according to claim 8, wherein the gate electrode is laterally between the first and second source/drain electrodes in a first dimension, and wherein the opposite sidewalls of the fin structure are laterally between the pair of leg portions in a second dimension orthogonal to the first dimension.

17. A method for forming a semiconductor device, the method comprising:

forming a semiconductor film comprising a first channel layer, a first barrier layer, a second channel layer, and a second barrier layer that are vertically stacked, wherein the first channel layer and the first barrier layer contact at a first heterojunction and the second channel layer and the second barrier layer contact at a second heterojunction overlying the first heterojunction, and wherein a first two-dimensional carrier gas (2DCG) and a second 2DCG are respectively in the first and second channel layers;

performing a first etch into the semiconductor film to form a fin structure;

after the first etch, performing a second etch into the fin structure to form a plurality of recesses, which expose individual sidewalls of the second channel layer and the second barrier layer;

forming a first source/drain electrode and a second source/drain electrode, wherein the first source/drain electrode is formed filling the plurality of recesses; and forming a gate electrode overlying the fin structure, laterally between the first and second source/drain electrodes, wherein the gate electrode straddles the fin structure with a pair of leg portions between which the fin structure is laterally and directly arranged, and wherein the pair of leg portions have individual bottom surfaces recessed relative to the second 2DCG and elevated relative to the first 2DCG.

18. The method according to claim 17, wherein the plurality of recesses expose a sidewall of the first barrier layer and are spaced from the first channel layer.

19. The method according to claim 17, wherein the second etch forms an additional plurality of recesses, which expose individual sidewalls of the second channel layer and the second barrier layer, and wherein the second source/drain electrode is formed filling the additional plurality of recesses.

20. The method according to claim 17, wherein the first etch extends into the first channel layer and stops before etching through an entire thickness of the first channel layer.

* * * * *